US012776470B2

(12) United States Patent
Chen et al.

(10) Patent No.: US 12,776,470 B2
(45) Date of Patent: Oct. 27, 2026

(54) METHOD OF GENERATING A SAMPLE MAP, COMPUTER PROGRAM PRODUCT, CHARGED PARTICLE INSPECTION SYSTEM, METHOD OF PROCESSING A SAMPLE, ASSESSMENT METHOD

(71) Applicant: ASML NETHERLANDS B.V., Veldhoven (NL)

(72) Inventors: Tzu-Chao Chen, Dublin, CA (US); Te-Sheng Wang, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 305 days.

(21) Appl. No.: 18/744,367

(22) Filed: Jun. 14, 2024

(65) Prior Publication Data

US 2024/0339295 A1 Oct. 10, 2024

Related U.S. Application Data

(63) Continuation of application No. PCT/EP2022/082359, filed on Nov. 18, 2022.

(Continued)

(51) Int. Cl.
*H01J 37/153* (2006.01)

(52) U.S. Cl.
CPC .................................. *H01J 37/153* (2013.01)

(58) Field of Classification Search
CPC ................... H01J 37/153; H01J 37/244; H01J 2237/20292; H01J 2237/221;

(Continued)

(56) References Cited

U.S. PATENT DOCUMENTS 6,411,386 B1 * 6/2002 Nishi ..................... G01B 11/26 356/399
2008/0078947 A1 4/2008 Horiuchi et al.

(Continued)

FOREIGN PATENT DOCUMENTS

CN 110415291 A 11/2019
CN 111127521 B 3/2024

(Continued)

OTHER PUBLICATIONS

International Search Report issued by the International Searching Authority issued in related Foreign Application No. PCT/EP2022/082359, mailed Mar. 13, 2023.

*Primary Examiner* — Kiet T Nguyen
(74) *Attorney, Agent, or Firm* — Finnegan, Henderson, Farabow, Garrett & Dunner LLP

(57) ABSTRACT

Methods are disclosed for generating a sample map and processing a sample. In one arrangement, a method comprises measuring a position of a first mark in each of a plurality of field regions on sample. A first model is fitted to the measured positions of the first marks. The fitted first model represents positions of the field regions. The method comprises measuring positions of a plurality of second marks in one field region or in each of a plurality of field regions. A second model is fitted to the measured positions of the second marks. The fitted second model represents a shape of each field region. A sample map is output using the fitted first and second models.

20 Claims, 11 Drawing Sheets

Related U.S. Application Data

(60) Provisional application No. 63/361,395, filed on Dec. 15, 2021.

(58) Field of Classification Search
CPC ... H01J 2237/2817; G06T 2207/10061; G06T 2207/20021; G06T 2207/30148; G06T 2207/30208; G06T 7/73; H10P 74/203; G03F 9/7003; G03F 7/7065; G03F 7/70655; G03F 1/84
USPC .......................................................... 250/310
See application file for complete search history.

(56) References Cited

U.S. PATENT DOCUMENTS

| | | | |
|---|---|---|---|
| 2019/0137892 | A1 | 5/2019 | Cekli et al. |
| 2019/0259564 | A1 | 8/2019 | Kruit et al. |
| 2019/0259570 | A1 | 8/2019 | Kruit et al. |
| 2020/0118784 | A1 | 4/2020 | Jiang et al. |
| 2020/0203116 | A1 | 6/2020 | Winkler et al. |

FOREIGN PATENT DOCUMENTS

| | | | |
|---|---|---|---|
| EP | 1602121 | B1 | 6/2012 |
| EP | 2702595 | B1 | 1/2020 |
| EP | 2715768 | B1 | 1/2020 |
| EP | 3937204 | A1 | 1/2022 |
| EP | 4020565 | A1 | 6/2022 |
| EP | 4086933 | A1 | 11/2022 |
| TW | 201207356 | A | 2/2012 |

* cited by examiner

METHOD OF GENERATING A SAMPLE MAP, COMPUTER PROGRAM PRODUCT, CHARGED PARTICLE INSPECTION SYSTEM, METHOD OF PROCESSING A SAMPLE, ASSESSMENT METHOD

CROSS-REFERENCE TO RELATED APPLICATIONS

This application claims priority of International application PCT/EP2022/082359, filed on 18 Nov. 2022, which claims priority of U.S. application 63/361,395, filed on 15 Dec. 2021. These applications are incorporated herein by reference in their entireties.

FIELD

The embodiments disclosed herein relate to generating a sample map for use in an assessment process, for example to identify defects in a pattern.

BACKGROUND

When manufacturing semiconductor integrated circuit (IC) chips, undesired pattern defects, as a consequence of, for example, optical effects and incidental particles, inevitably occur on a substrate (i.e., wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection apparatuses with a charged particle beam have been used to inspect objects, which may be referred to as samples, for example to detect pattern defects. These apparatuses typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause signal electrons to be emitted from the surface, such as secondary electrons, backscattered electrons, or Auger electrons. The signal electrons may be emitted from the material structure of the sample. By scanning the primary electron beam as the probing spot over the sample surface, signal electrons can be emitted across the surface of the sample. By collecting these emitted signal electrons from the sample surface, a pattern inspection apparatus may obtain an image representing characteristics of the material structure of the surface of the sample.

Patterns may be arranged in multiple field regions. Each field region may in turn contain multiple die regions. Typically, at least a portion of the field regions are nominally rectangular and arranged in a regular array of rows and columns. Imperfections in patterning processes lead to deviations in the shapes and positions of the field regions. Alignment marks may be measured and used to predict the shapes and positions of the field regions (and die regions therein). Inaccuracies in such maps can reduce the throughput of sample assessment methods by making it harder to locate features of interest in a sample to be assessed.

There is a general need to improve throughput of sample assessment methods.

SUMMARY

It is an object of the present disclosure to provide embodiments that support improved throughput in sample assessment methods.

According to some embodiments of the present disclosure, there is provided a method of generating a sample map, the method comprising: obtaining a sample having field regions; measuring a position of a first mark in each of a plurality of the field regions; fitting a first model to the measured positions of the first marks, the fitted first model representing positions of the field regions; measuring positions of a plurality of second marks in one field region or in each of a plurality of field regions; fitting a second model to the measured positions of the second marks, the fitted second model representing a shape of each field region; and outputting a sample map using the fitted first and second models.

According to some embodiments of the present disclosure, there is provided a method of generating a sample map, wherein the sample map comprises information about positions and shapes of field regions on the sample, the method comprising: providing a sample having field regions; receiving exposure correction data from a lithographic apparatus used to expose each of the field regions; and using the exposure correction data to generate the sample map.

According to some embodiments of the present disclosure, there is provided a computer program product comprising instructions which, when the program is executed by a computer, cause the computer to carry out the following steps: receiving data representing a measured position of a first mark in each of a plurality of field regions on a sample; fitting a first model to the measured positions of the first marks, the fitted first model representing positions of the field regions; receiving data representing measured positions of a plurality of second marks in one field region or in each of a plurality of field regions; fitting a second model to the measured positions of the second marks, the fitted second model representing a shape of each field region; and outputting a sample map using the fitted first and second models.

According to some embodiments of the present disclosure, there is provided a computer program product comprising instructions which, when the program is executed by a computer, cause the computer to carry out the following steps: receiving exposure correction data from a lithographic apparatus used to expose field regions on a sample; and using the exposure correction data to generate a sample map comprising information about positions and shapes of field regions on the sample.

According to some embodiments of the present disclosure, there is provided a charged particle beam inspection system, comprising: a sample holder configured to hold a sample having field regions; an electron beam system configured to project one or more electron beams onto the sample and to detect signal electrons emitted from the sample; and a controller configured to: cause the electron beam system to measure a position of a first mark in each of a plurality of the field regions; fit a first model to the measured positions of the first marks, the fitted first model representing positions of the field regions; cause the electron beam system to measure positions of a plurality of second marks in one field region or in each of a plurality of field regions; fit a second model to the measured positions of the second marks, the fitted second model representing a shape of each field region; and output a sample map using the fitted first and second models.

According to some embodiments of the present disclosure, there is provided a charged particle beam inspection system, comprising: a sample holder configured to hold a sample having field regions; an electron beam system configured to project one or more electron beams onto the sample and to detect signal electrons emitted from the sample; and a controller configured to: receive exposure correction data from a lithographic apparatus used to expose field regions on a sample; and use the exposure correction data to generate a sample map comprising information about positions and shapes of field regions on the sample.

BRIEF DESCRIPTION OF FIGURES

The above and other aspects of the present disclosure will become more apparent from the description of exemplary embodiments, taken in conjunction with the accompanying drawings.

Figure 1:
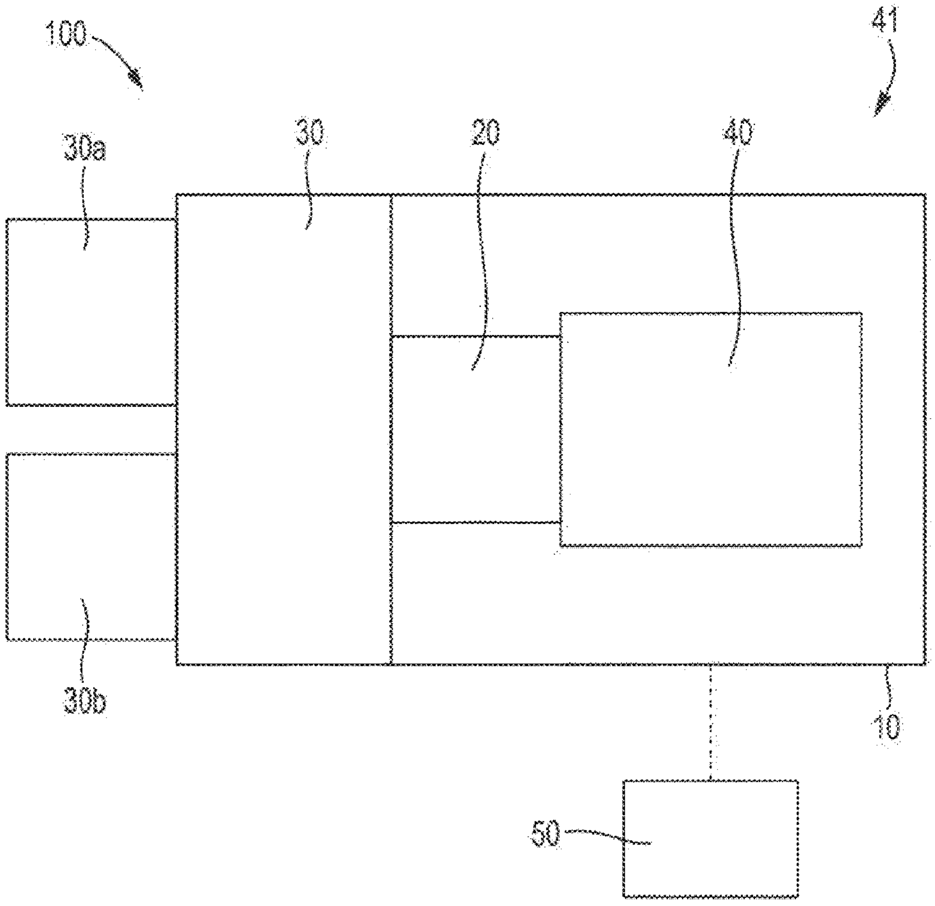
FIG. 1 is a schematic diagram illustrating an exemplary charged particle beam inspection system.

The schematic diagrams and views show the components described below. However, the components depicted in the figures are not to scale.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the embodiments as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Just one “killer defect” can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If each individual step had a yield of 95%, the overall process yield would be as low as 7%.

While high process yield is desirable in an IC chip manufacturing facility, maintaining a high substrate (i.e., wafer) throughput, defined as the number of substrates processed per hour, is also essential. High process yield and high substrate throughput can be impacted by the presence of a defect. This is especially true if operator intervention is required for reviewing the defects. Thus, high throughput detection and identification of micro and nano-scale defects by inspection devices (such as a Scanning Electron Microscope (‘SEM’)) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e., a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

An implementation of a known multi-beam inspection apparatus is described below.

While the description and drawings are directed to an electron-optical system, it is appreciated that the embodiments are not used to limit the present disclosure to specific charged particles. References to electrons throughout the present document may therefore be more generally considered to be references to charged particles, with the charged particles not necessarily being electrons.

Reference is now made to FIG. 1, which is a schematic diagram illustrating an exemplary charged particle beam inspection system 100, which may also be referred to as a charged particle beam assessment system or simply assessment system. The charged particle beam inspection system 100 of FIG. 1 includes a main chamber 10, a load lock chamber 20, an electron beam system 40, an equipment front end module (EFEM) 30 and a controller 50. The electron beam system 40 is located within the main chamber 10.

The EFEM 30 includes a first loading port 30*a* and a second loading port 30*b*. The EFEM 30 may include additional loading port(s). The first loading port 30*a* and the second loading port 30*b* may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in the EFEM 30 transport the samples to the load lock chamber 20.

The load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from the load lock chamber 20 to the main chamber 10. The main chamber 10 is connected to a main chamber vacuum pump system (not shown). The main chamber vacuum pump system removes gas particles in the main chamber 10 so that the pressure around the sample reaches a second pressure lower than the first pressure. After reaching the second pressure, the sample is transported to the electron beam system by which it may be inspected. An electron beam system 40 may comprise a single-beam electron-optical apparatus or a multi-beam electron-optical apparatus.

The controller 50 is electronically connected to electron beam system 40. The controller 50 may be a processor (such as a computer) configured to control the charged particle beam inspection apparatus 100. The controller 50 may also include a processing circuitry configured to execute various signal and image processing functions. While the controller 50 is shown in FIG. 1 as being outside of the structure that includes the main chamber 10, the load lock chamber 20, and the EFEM 30, it is appreciated that the controller 50 may be part of the structure. The controller 50 may be located in one of the component elements of the charged particle beam inspection apparatus or it can be distributed over at least two of the component elements. While the present disclosure provides examples of the main chamber 10 housing an electron beam system, it should be noted that aspects of the disclosure in their broadest sense are not limited to a chamber housing an electron beam system. Rather, it is appreciated that the foregoing principles may also be applied to other devices, and other arrangements of apparatus, that operate under the second pressure.

Figure 2:
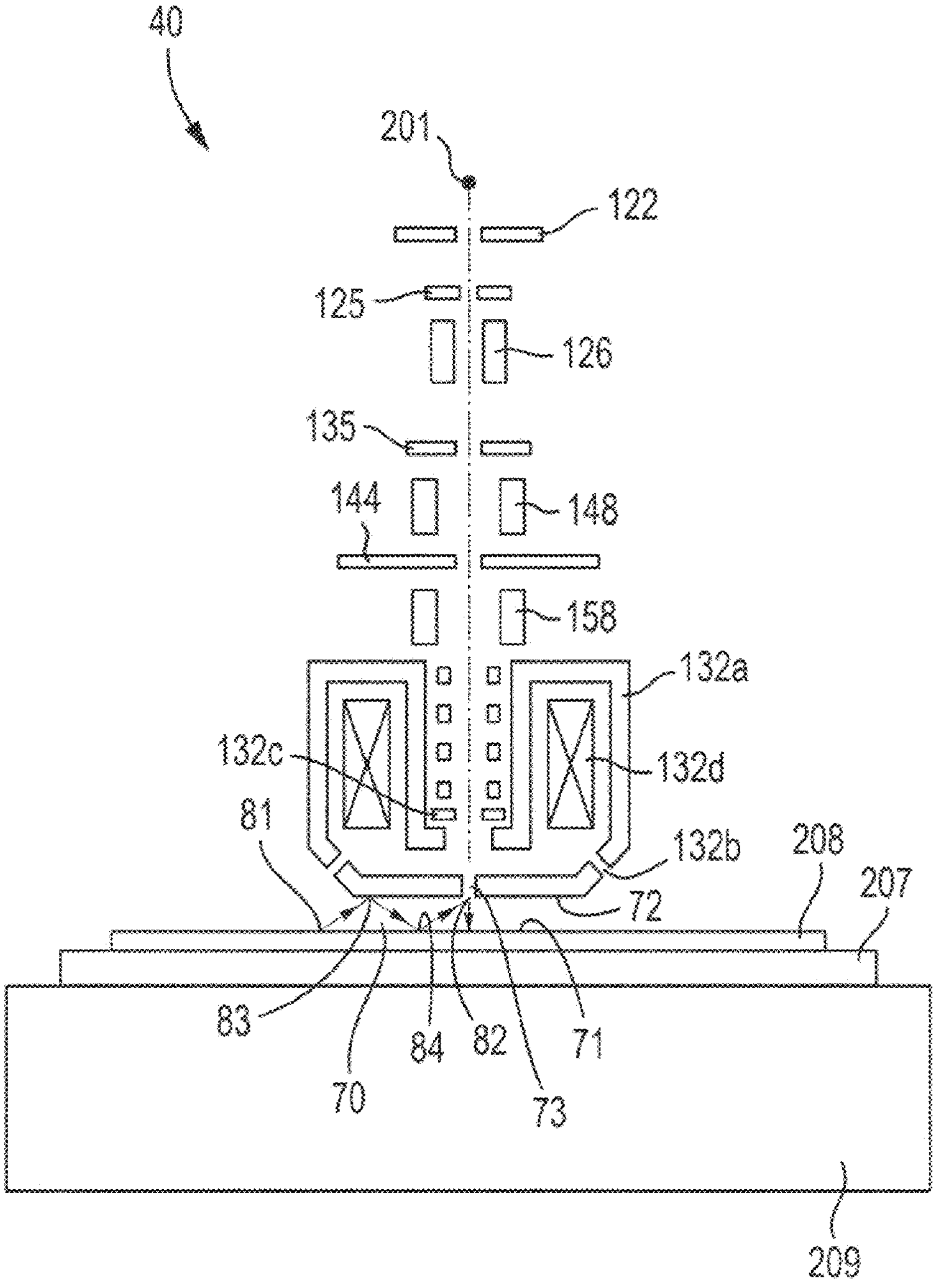
FIG. 2 is a schematic diagram of an exemplary single beam electron beam system.

Reference is now made to FIG. 2, which is a schematic diagram of an exemplary single beam electron beam system 40, which may be provided as part of the exemplary charged particle beam inspection system 100 of FIG. 1. The electron beam system 40 comprises a sample holder 207 supported by a motorized stage 209 to hold a sample 208 to be inspected. The electron beam system 40 comprises an electron source 201. The electron beam system 40 further comprises a gun aperture 122, a beam limit aperture 125, a condenser lens 126, a column aperture 135, an objective lens assembly 132*a-d*, and an electron detector 144. The objective lens assembly 132*a-d*, in some embodiments, may be a modified swing objective retarding immersion lens (SORIL), which includes a pole piece 132*a*, a control electrode 132*b*, a deflector 132*c*, and an exciting coil 132*d*. The control electrode 132*b* has an aperture formed in it for the passage of the electron beam. The control electrode 132*b* forms the facing surface 72.

In an imaging process, an electron beam emanating from the source 201 may pass through the gun aperture 122, the beam limit aperture 125, the condenser lens 126, and be focused into a probe spot by the modified SORIL lens and then impinge onto the surface of sample 208. The probe spot may be scanned across the surface of the sample 208 by the deflector 132*c* or other deflectors in the SORIL lens. Secondary electrons emanated from the sample surface may be collected by the electron detector 144 to form an image of an area of interest on the sample 208.

The condenser and illumination optics of the electron-optical system 41 may comprise or be supplemented by electromagnetic quadrupole electron lenses. For example, as shown in FIG. 2 the electron beam system 40 may comprise a first quadrupole lens 148 and a second quadrupole lens 158. In some embodiments, the quadrupole lenses are used for controlling the electron beam. For example, first quadrupole lens 148 can be controlled to adjust the beam current and second quadrupole lens 158 can be controlled to adjust the beam spot size and beam shape.

Figure 3:
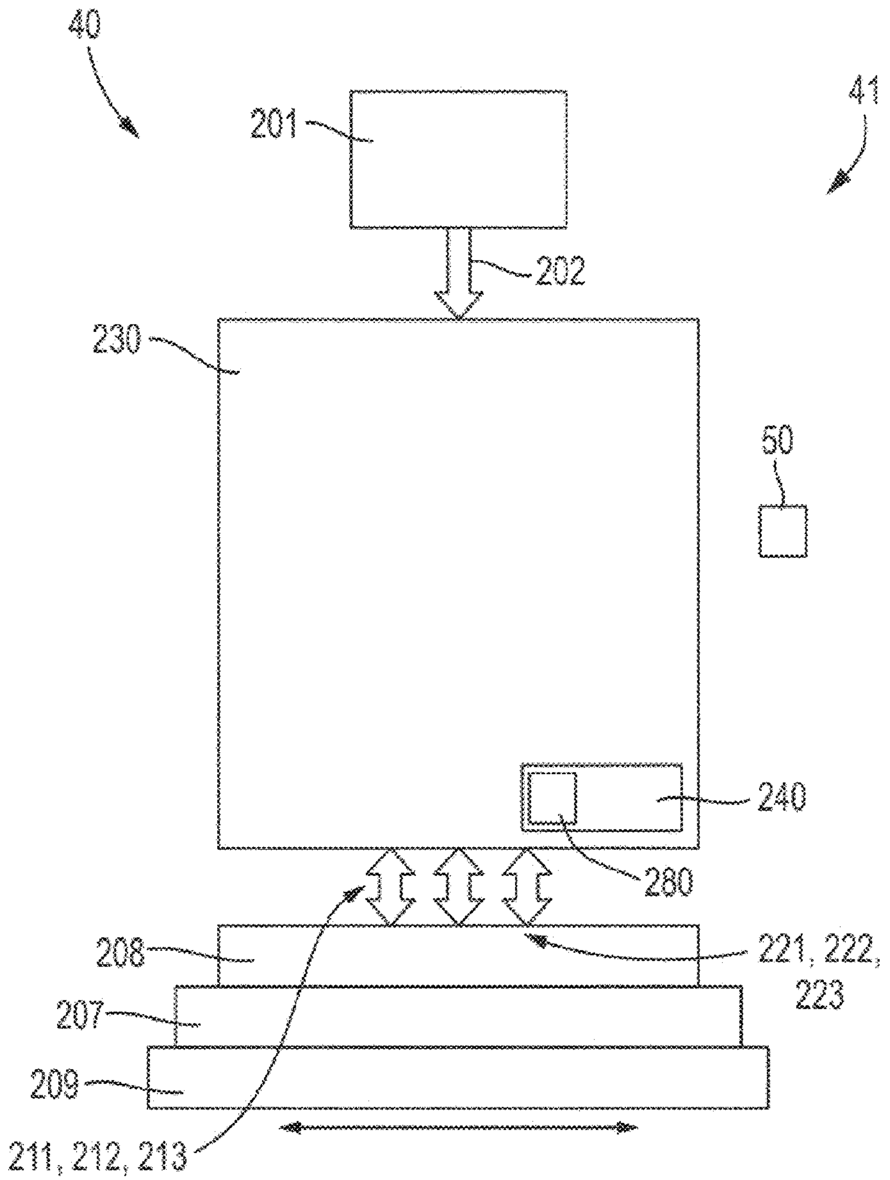
FIG. 3 is a schematic diagram of an exemplary multi-beam electron beam system.

Reference is now made to FIG. 3, which is a schematic diagram illustrating an exemplary electron beam system 40 including a multi-beam electron-optical system 41, which may be provided as part of the exemplary charged particle beam inspection system 100 of FIG. 1. The electron beam system 40 comprises an electron source 201 and a projection apparatus 230. The electron beam system 40 further comprises a motorized stage 209 and a sample holder 207. The electron source 201 and projection apparatus 230 may together be referred to as the electron-optical system 41 or as an electron-optical column. The sample holder 207 is supported by motorized stage 209 so as to hold a sample 208 (e.g., a substrate or a mask) for inspection. The multi-beam electron-optical system 41 further comprises a detector 240 (e.g., an electron detection device).

The electron source 201 may comprise a cathode (not shown) and an extractor or anode (not shown). During operation, the electron source 201 is configured to emit electrons as primary electrons from the cathode. The primary electrons are extracted or accelerated by the extractor and/or the anode to form a primary electron beam 202.

The projection apparatus 230 is configured to convert the primary electron beam 202 into a plurality of sub-beams 211, 212, 213 and to direct each sub-beam onto the sample 208. Although three sub-beams are illustrated for simplicity, there may be many tens, many hundreds, many thousands, many tens of thousands or many hundreds of thousands of sub-beams. The sub-beams may be referred to as beamlets.

The controller 50 may be connected to various parts of the charged particle beam inspection apparatus 100 of FIG. 1, such as the electron source 201, the detector 240, the projection apparatus 230, and the motorized stage 209. The controller 50 may perform various image and signal processing functions. The controller 50 may also generate various control signals to govern operations of the charged particle beam inspection apparatus, including the charged particle multi-beam apparatus.

The projection apparatus 230 may be configured to focus sub-beams 211, 212, and 213 onto a sample 208 for inspection and may form three probe spots 221, 222, and 223 on the surface of sample 208. The projection apparatus 230 may be configured to deflect the primary sub-beams 211, 212, and 213 to scan the probe spots 221, 222, and 223 across individual scanning areas in a section of the surface of the sample 208. In response to incidence of the primary sub-beams 211, 212, and 213 on the probe spots 221, 222, and 223 on the sample 208, electrons are generated from the sample 208 which include secondary electrons and backscattered electrons which may be referred to as signal particles. The secondary electrons typically have electron energy less than or equal to 50 eV. Actual secondary electrons can have an energy of less than 5 eV, but anything beneath 50 eV is generally treated at a secondary electron. Backscattered electrons typically have electron energy between 0 eV and the landing energy of the primary sub-beams 211, 212, and 213. As electrons detected with an energy of less than 50 eV is generally treated as a secondary electron, a proportion of the actual backscatter electrons will be counted as secondary electrons.

The detector 240 is configured to detect signal particles such as secondary electrons and/or backscattered electrons and to generate corresponding signals which are sent to a signal processing system 280, e.g., to construct images of the corresponding scanned areas of sample 208. The detector 240 may be incorporated into the projection apparatus 230.

The signal processing system 280 may comprise a circuit (not shown) configured to process signals from the detector 240 so as to form an image. The signal processing system 280 could otherwise be referred to as an image processing system. The signal processing system may be incorporated into a component of the electron beam system 40 such as the detector 240 (as shown in FIG. 3). However, the signal processing system 280 may be incorporated into any number of components of the inspection apparatus 100 or electron beam system 40, such as, as part of the projection apparatus 230 or the controller 50. The signal processing system 280 may include an image acquirer (not shown) and a storage device (not shown). For example, the signal processing system may comprise a processor, computer, server, mainframe host, terminals, personal computer, any kind of mobile computing devices, and the like, or a combination thereof. The image acquirer may comprise at least part of the processing function of the controller. Thus, the image acquirer may comprise at least one or more processors. The image acquirer may be communicatively coupled to the detector 240 permitting signal communication, such as an electrical conductor, optical fiber cable, portable storage media, IR. Bluetooth, internet, wireless network, wireless radio, among others, or a combination thereof. The image acquirer may receive a signal from the detector 240, may process the data comprised in the signal and may construct an image therefrom. The image acquirer may thus acquire images of the sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The signal processing system 280 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of the sample 208. The reconstructed images can thereby be used to reveal any defects that may exist in the sample. The above functions of the signal processing system 280 may be carried out in the controller 50 or shared between the signal processing systems 280 and controller 50 as convenient.

The controller 50 may control the motorized stage 209 to move sample 208 during inspection of the sample 208. The controller 50 may enable the motorized stage 209 to move the sample 208 in a direction, preferably continuously, for example at a constant speed, at least during sample inspection, which may be referred to as a type of scanning. The controller 50 may control movement of the motorized stage 209 so that it changes the speed of the movement of the sample 208 dependent on various parameters. For example, the controller 50 may control the stage speed (including its direction) depending on the characteristics of the inspection steps of scanning process and/or scans of the scanning process for example as disclosed in EPA 21171877.0 filed 3 May 2021 which is hereby incorporated in so far as the combined stepping and scanning strategy at least of the stage.

Known multi-beam systems, such as the electron beam system 40 and charged particle beam inspection apparatus 100 described above, are disclosed in US2020118784, Us20200203116, US 2019/0259570 and US2019/0259564 which are hereby incorporated by reference.

The electron beam system 40 may comprise a projection assembly to regulate accumulated charges on the sample by illuminating the sample 208.

Figure 4:
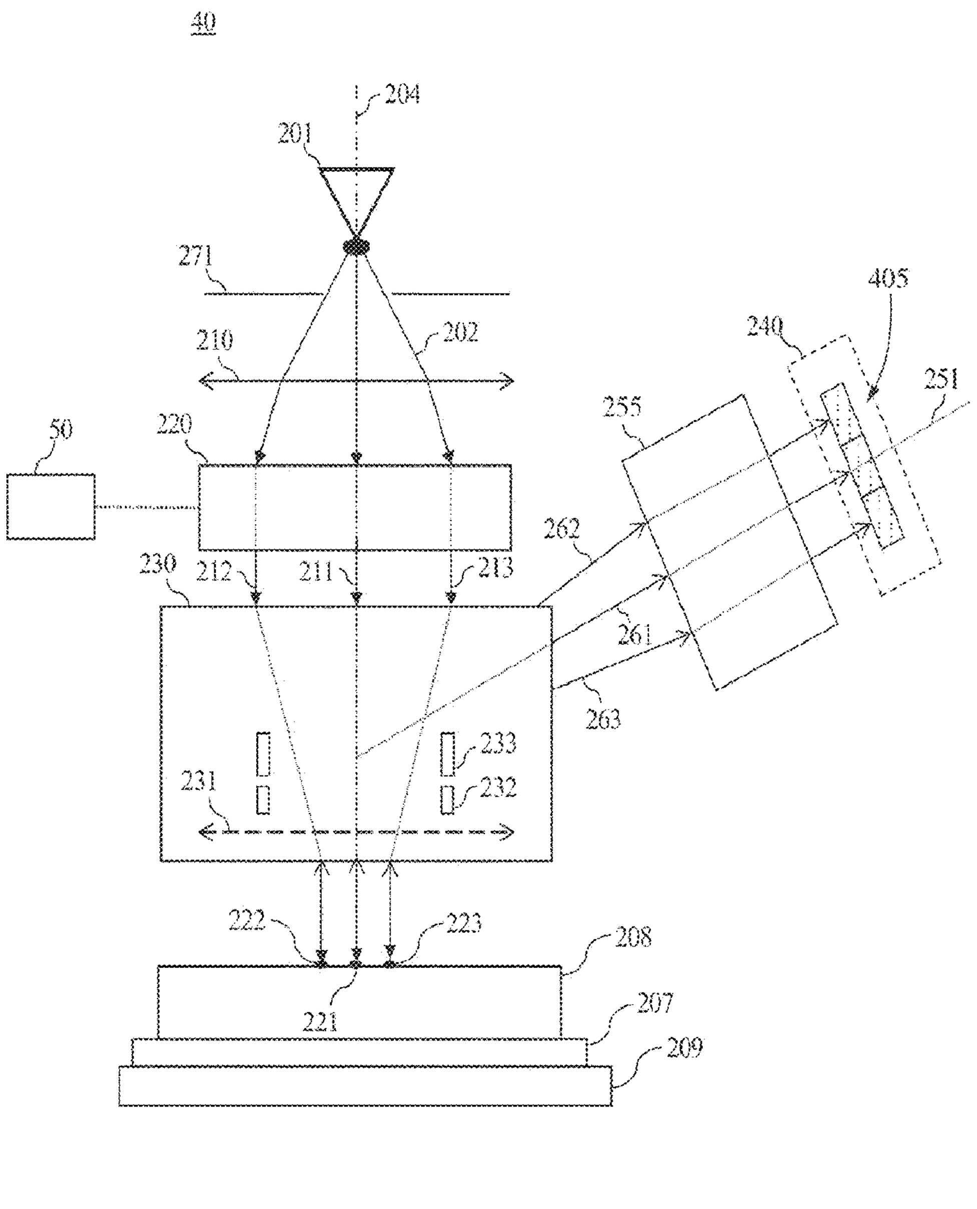
FIG. 4 is a schematic diagram of a further exemplary multi-beam electron beam system.

Reference is now made to FIG. 4, which is a schematic diagram illustrating an exemplary electron beam system 40, which may be provided as part of the exemplary charged particle beam inspection system 100 of FIG. 1. As exemplified above in FIG. 3, in some embodiments the electron beam system 40 comprises a detector 240 that is aligned with a main electron-optical axis of the electron beam system 40. Alternatively, the detector 240 may be aligned with a different axis, as shown in FIG. 4.

Features that are the same as those described above are given the same reference numerals. For conciseness, such features are not described in detail with reference to FIG. 4. For example, the source 201, the primary electron beam 202, the sub-beams 211, 212 and 213, the projection apparatus 230, the probe spots 221, 222, 223, the controller 50, the sample 208, the sample holder 207, the motorized stage 209 and the detector 240 may be as described above.

The electron source 201, a gun aperture plate 271, a condenser lens 210 and a source conversion unit 220 are components of an illumination apparatus forming part of the electron beam system 40. The gun aperture plate 271, in operation, is configured to block off peripheral electrons of primary electron beam 202 to reduce the Coulomb effect. The gun aperture plate 271 may be referred to as a Coulomb Aperture Array. The Coulomb effect may enlarge the size of each of probe spots 221, 222, and 223 of primary sub-beams 211, 212, 213, and therefore deteriorate inspection resolution. A gun aperture plate 271 may also include multiple openings for generating primary sub-beams (not shown) even before the source conversion unit 220 and may be referred to as a coulomb aperture array.

The condenser lens 210 is configured to focus (or collimate) primary electron beam 202. In an example of the source conversion unit 220, the source conversion unit 220 may comprise an image-forming element array, an aberration compensator array, a beam-limit aperture array, and a pre-bending micro-deflector array. The pre-bending micro-deflector array may, for example, be optional and may be present in embodiments in which the condenser lens does not ensure substantially normal incidence of sub-beams originating from the coulomb aperture array onto e.g., the beam-limit aperture array, the image-forming element array, and/or the aberration compensator array.

The electron beam system 40 may comprise a secondary projection apparatus 255 associated with the detector 240. The primary projection apparatus 230 may comprise an array of condenser lenses 231 which may be magnetic, which may function as an objective lens. A beam separator 233 and a deflection scanning unit 232 may be positioned inside primary projection apparatus 230. The beam separator 233 may comprise a Wien filter. The detector 240 may comprise a plurality of detector elements 405 (e.g., in the form of a detector array).

The components that are used to generate a primary beam may be aligned with a primary electron-optical axis 204 of the electron beam system 40. These components may include: the electron source 201, the gun aperture plate 271, the condenser lens 210, the source conversion unit 220, the beam separator 233, the deflection scanning unit 232 and the primary projection apparatus 230. The secondary projection apparatus 255 and its associated detector array 240 may be aligned with a secondary electron-optical axis 251 of the electron beam system 40.

In some embodiments, the secondary electrons propagate in three secondary electron beams 261, 262, and 263. The secondary projection apparatus 255 subsequently focuses the path of secondary electron beams 261, 262, and 263 onto a plurality of detector elements 405 of the detector 240.

The detector elements 405 may detect the secondary electron beams 261, 262, and 263. On incidence of secondary electron beams with the detector elements 405, the elements may generate corresponding intensity signal outputs (not shown). In some embodiments, the detector elements may capture electrodes. The outputs may be directed to the image processing system.

Figure 5:
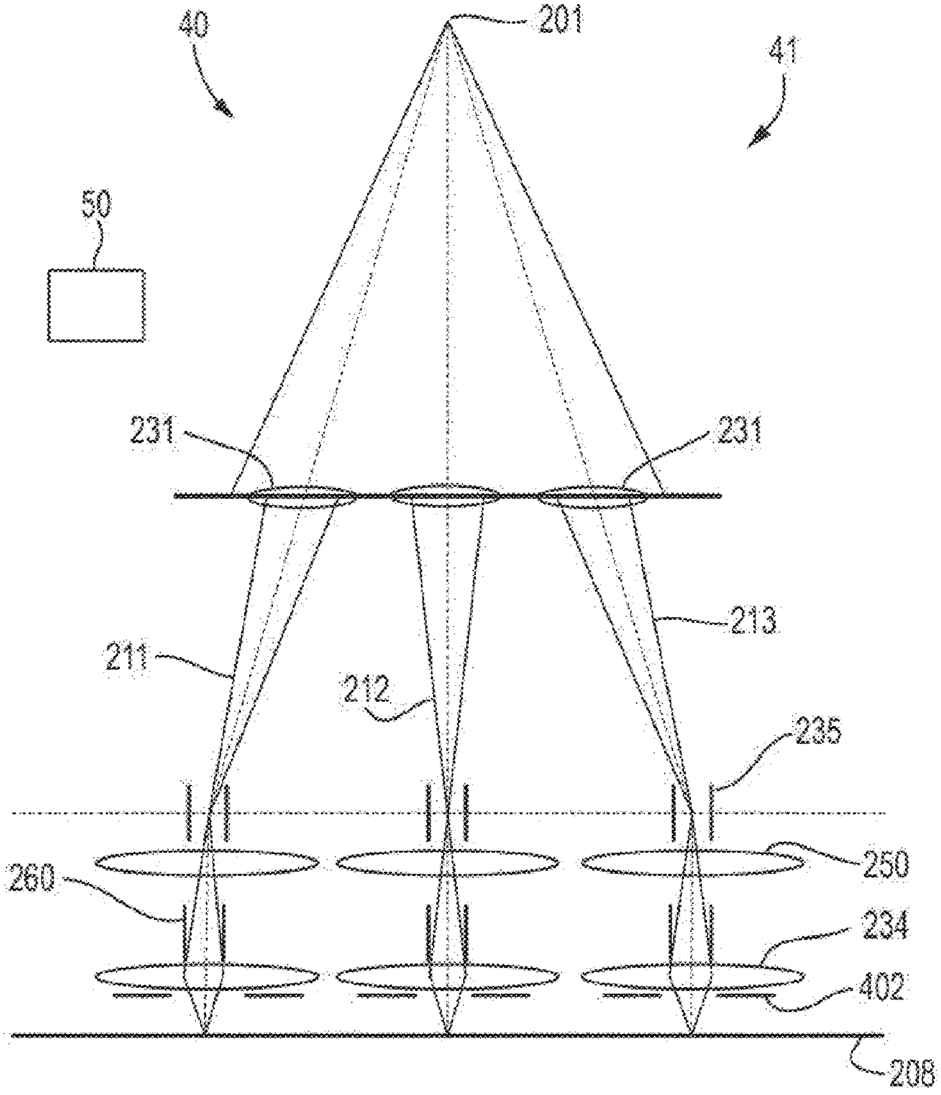
FIG. 5 is a schematic diagram of an exemplary multi-beam electron beam system comprising a condenser lens array.

FIG. 5 schematically depicts an electron beam system 40 including an electron-optical column 41 according to some embodiments. The electron-optical column 41 may form part of an electron beam system 40, which may be provided as part of the exemplary charged particle beam system 100 of FIG. 1. For case of illustration, lens arrays are depicted schematically herein by arrays of oval shapes. Each oval shape represents one of the lenses in the lens array. The oval shape is used by convention to represent a lens, by analogy to the biconvex form often adopted in optical lenses. In the context of charged particle arrangements such as those discussed herein, it will be understood however that lens arrays will typically operate electrostatically and so may not require any physical elements adopting a biconvex shape. As described below, lens arrays may instead comprise multiple plates with apertures. Each plate with apertures may be referred to as an electrode. The electrodes may be provided in series along sub-beam paths of sub-beams of a multi-beam.

The electron source 201 directs electrons toward an array of condenser lenses 231 (otherwise referred to as a condenser lens array). The electron source 201 is desirably a high brightness thermal field emitter with a good compromise between brightness and total emission current. There may be many tens, many hundreds, or many thousands of condenser lenses 231. The condenser lenses 231 may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The array of condenser lenses 231 may take the form of at least two plates, preferably three, acting as electrodes, with an aperture in each plate aligned with each other and corresponding to the location of a sub-beam. At least two of the plates are maintained during operation at different potentials to achieve the desired lensing effect. Between the plates of the condenser lens array are electrically insulating plates for example made of an insulating material such as ceramic or glass, with one or more apertures for the sub-beams. An alternative arrangement one more of the plates may feature apertures each with their own electrode, each with an array of electrodes around their perimeter or arranged in groups of apertures having a common electrode.

In an arrangement the array of condenser lenses 231 is formed of three plate arrays in which charged particles have the same energy as they enter and leave each lens, which arrangement may be referred to as an Einzel lens. Thus, dispersion only occurs within the Einzel lens itself (between entry and exit electrodes of the lens), thereby limiting off-axis chromatic aberrations. When the thickness of the condenser lenses is low, e.g., a few mm, such aberrations have a small or negligible effect.

Each condenser lens in the array directs electrons into a respective sub-beam 211, 212, 213 which is focused at a respective intermediate focus 233. A collimator or an array of collimators may be positioned to operate on the respective intermediate focus 233. The collimators may take the form of deflectors 235 provided at the intermediate focuses 233. Deflectors 235 are configured to bend a respective beamlet 211, 212, 213 by an amount effective to ensure that the principal ray (which may also be referred to as the beam axis) is incident on the sample 208 substantially normally (i.e., at substantially 90° to the nominal surface of the sample).

Below (i.e., downbeam of or further from source 201) deflectors 235 there is a control lens array 250 comprising a control lens 251 for each sub-beam 211, 212, 213. Control lens array 250 may comprise two or more, preferably at least three, plate electrode arrays connected to respective potential sources, preferably with insulating plates in contact with the electrodes for example between the electrodes. Each of the plate electrode arrays may be referred to as a control electrode. A function of control lens array 250 is to optimize the beam opening angle with respect to the demagnification of the beam and/or to control the beam energy delivered to the objective lenses 234, each of which directs a respective sub-beam 211, 212, 213 onto the sample 208.

Optionally an array of scan deflectors 260 is provided between the control lens array 250 and the array of objective lenses 234 (objective lens array). The array of scan deflectors 260 comprises a scan deflector 261 for each sub-beam 211, 212, 213. Each scan deflector is configured to deflect a respective sub-beam 211, 212, 213 in one or two directions so as to scan the sub beam across the sample 208 in one or two directions.

A detector module 240 of a detector is provided within or between the objective lenses 234 and the sample 208 to detect signal electrons/particles emitted from the sample 208. An exemplary construction of such a detector module 240 is described below. Note that the detector additionally or alternative may have detector elements up-beam along the primary beam path of the objective lens array or even the control lens array.

In a variation on the arrangement of FIG. 5, the array of condenser lenses 231 may be omitted. Sub-beams may be derived from the beam, for example, using a beam limiter defining an array of beam-limiting apertures. The beam may separate into the sub-beams on meeting the control lens array 250. The sub-beams are substantially parallel on entry to the control lens array 250. The sub-beams of the multi-beam may be arranged in a pattern which may be referred to as a multi-beam arrangement. The pattern may form a grid. The grid may be hexagonal, rectilinear, rhombic, or square. A collimator (not shown) may be provided up-beam of the control lens array 250.

In the variation on the arrangement of FIG. 5 (not shown), the collimator may comprise a macro collimator. The macro collimator acts on the beam from the source 201 before the beam has been split into a multi-beam. The macro collimator bends respective portions of the beam by an amount effective to ensure that a beam axis of each of the sub-beams derived from the beam is incident on the sample 208 substantially normally (i.e., at substantially 90° to the nominal surface of the sample 208). The macro collimator comprises a magnetic lens and/or an electrostatic lens. In another arrangement (not shown), the macro-collimator may be partially or wholly replaced by a collimator element array provided down-beam of the upper beam limiter.

In the variation on the arrangement of FIG. 5 (not shown), a macro scan deflector may be provided to cause sub-beams to be scanned over the sample 208. The macro scan deflector deflects respective portions of the beam to cause the sub-beams to be scanned over the sample 208. In some embodiments, the macro scan deflector comprises a macroscopic multi-pole deflector, for example with eight poles or more. The deflection is such as to cause sub-beams derived from the beam to be scanned across the sample 208 in one direction (e.g., parallel to a single axis, such as an X axis) or in two directions (e.g., relative to two non-parallel axes, such as X and Y axes). The macro scan deflector acts macroscopically on all of the beam rather than comprising an array of deflector elements that are each configured to act on a different individual portion of the beam. The macro scan deflector may be provided between the macro collimator and the control lens array 250. In another arrangement (not shown), the macro scan deflector may be partially or wholly replaced by a scan deflector array, for example as a scan deflector for each sub-beam. In other arrangement (not shown), both a macro scan deflector and the scan-deflector array are provided, and they may operate in synchronization.

In some embodiments, the electron-optical column 41 further comprises an upper beam limiter. The upper beam limiter defines an array of beam-limiting apertures. The upper beam limiter may be referred to as an upper beam-limiting aperture array or up-beam beam-limiting aperture array. The upper beam limiter may comprise a plate (which may be a plate-like body) having a plurality of apertures. The upper beam limiter forms sub-beams from a beam of charged particles emitted by the source 201. Portions of the beam other than those contributing to forming the sub-beams may be blocked (e.g., absorbed) by the upper beam limiter so as not to interfere with the sub-beams down-beam. The upper beam limiter may be referred to as a sub-beam defining aperture array.

In some embodiments, the objective lens array assembly (which is a unit that comprises the objective lenses 234) further comprises a beam shaping limiter. The beam shaping limiter defines an array of beam-limiting apertures. The beam shaping limiter may be referred to as a lower beam limiter, lower beam-limiting aperture array or final beam-limiting aperture array. The beam shaping limiter may comprise a plate (which may be a plate-like body) having a plurality of apertures. The beam shaping limiter may be down-beam from at least one electrode (optionally from all electrodes) of the control lens array 250. In some embodiments, the beam shaping limiter is down-beam from at least one electrode (optionally from all electrodes) of the objective lens array. In an arrangement, the beam shaping limiter is structurally integrated with an electrode of the objective lens array. Desirably, the beam shaping limiter is positioned in a region of low electrostatic field strength. The alignment of the beam liming apertures with the objective lens array is such that a portion of a sub-beam from the corresponding objective lens can pass through the beam-limiting aperture and impinge onto the sample 208, so that only a selected portion of the sub-beam incident onto the beam shaping limiter to pass through the beam-limiting aperture.

Any of the objective lens array assemblies described herein may further comprise a detector 240. The detector detects electrons emitted from the sample 208. The detected electrons may include any of the electrons detected by an SEM, including signal particles such as secondary and/or backscattered electrons emitted from the sample 208. An exemplary construction of a detector 240 is described in more detail below with reference to FIGS. 7 and 8.

Figure 6:
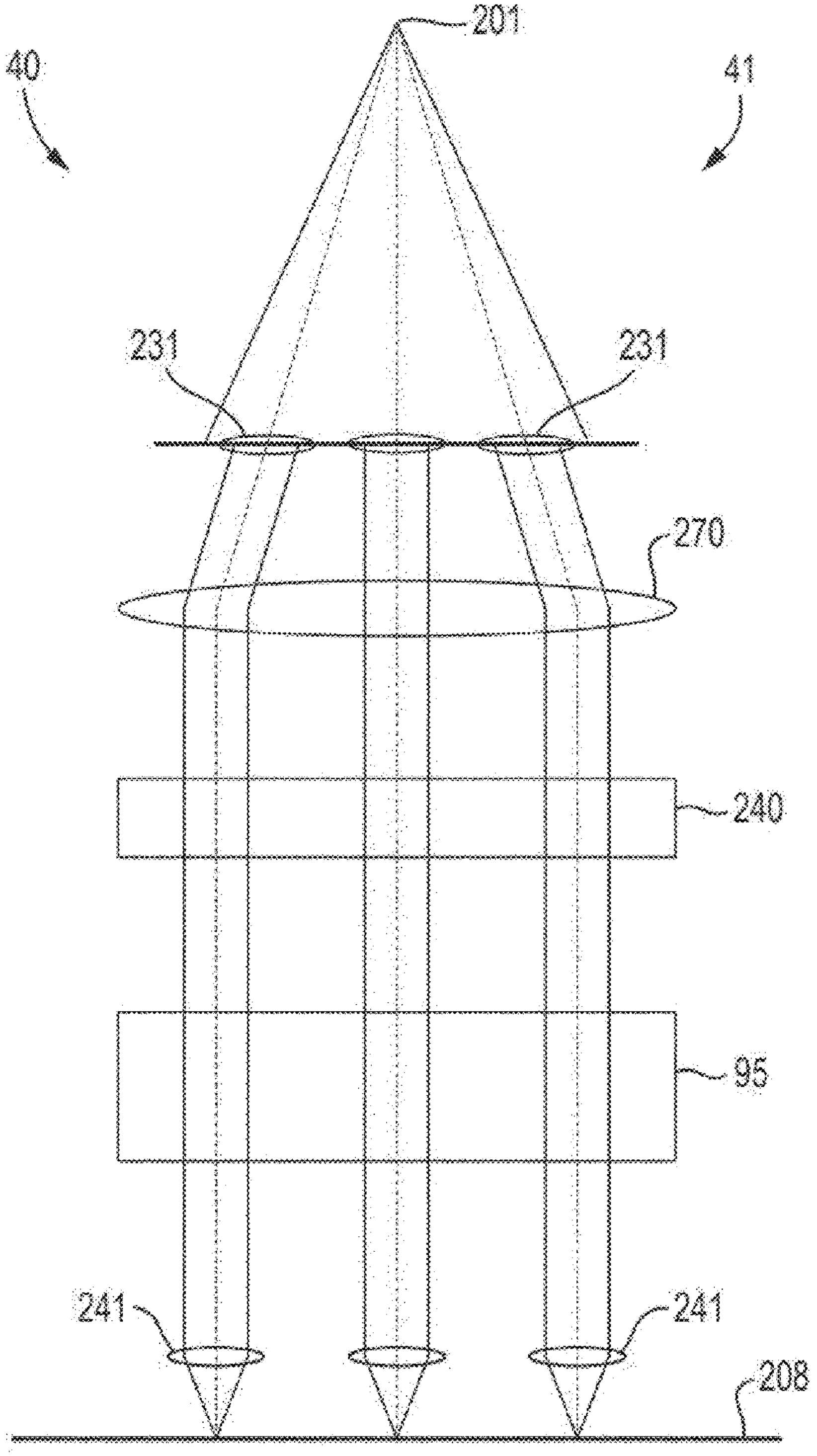
FIG. 6 is a schematic diagram of an exemplary electron beam system comprising a beam separator.

FIG. 6 schematically depicts an electron beam system 40 including an electron-optical column 41 according to some embodiments. Features that are the same as those described above are given the same reference numerals. For conciseness, such features are not described in detail with reference to FIG. 6. For example, the source 201, the condenser lenses 231, the macro collimator 270, the objective lens array 241 and the sample 208 may be as described above.

As described above, in some embodiments, the detector 240 is between the objective lens array 241 and the sample 208. The detector 240 may face the sample 208. Alternatively, as shown in FIG. 6, in some embodiments, the objective lens array 241, which comprises the plurality of objective lenses, is between the detector 240 and the sample 208.

In some embodiments, a deflector array 95 is between the detector 240 and the objective lens array 241. In some embodiments, the deflector array 95 comprises a Wien filter array so that deflector array may be referred to as a beam separator. The deflector array 95 is configured to provide a magnetic field to disentangle the charged particles projected to the sample 208 apart from the secondary electrons from the sample 208 towards the detector 240.

In some embodiments, the detector 240 is configured to detect signal particles by reference to the energy of the charged particle, i.e., dependent on a band gap. Such a detector 240 may be called an indirect current detector. The secondary electrons emitted from the sample 208 gain energy from the fields between the electrodes. The secondary electrons have sufficient energy once they reach the detector 240. In a different arrangement the detector 240 may be a scintillator array for example of fluorescing strip between the beams and that are positioned up beam along the primary beam path with respect to the Wien filter. Primary beams passing through the Wien filter array (of magnetic and electrostatic strips orthogonal to the primary beam path) have paths up beam and down beam of the Wien filter array that are substantially parallel, whereas signal electrons from the sample are directed by the Wien filter array towards the scintillator array. The generated photons are directed via a photon transport unit (e.g., an array of optical fibers) to a remote optical detector which generates a detection signal on detection of a photon.

Figure 7:
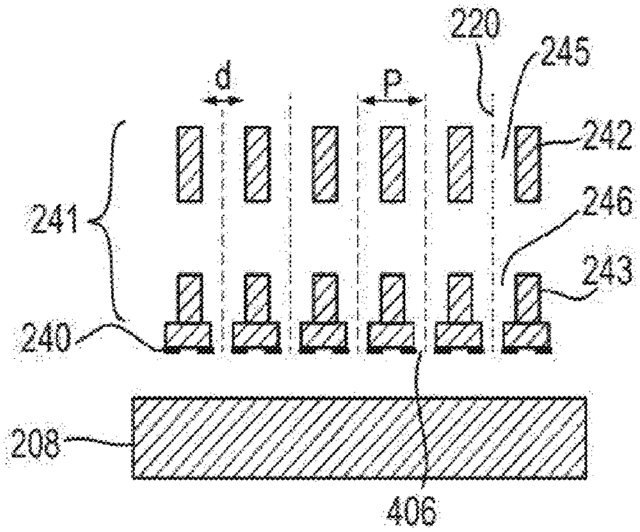
FIG. 7 is a schematic cross-sectional view of an objective lens array of a charged particle assessment system according to some embodiments.

The objective lens array 241 may comprise at least two electrodes in which are defined aperture arrays. In other words, the objective lens array comprises at least two electrodes with a plurality of holes or apertures. FIG. 7 shows electrodes 242, 243 which are part of an exemplary objective lens array 241 having respective aperture arrays 245, 246. The position of each aperture in an electrode corresponds to the position of a corresponding aperture in another electrode. The corresponding apertures operate in use on the same beam, sub-beam, or group of beams in the multi-beam. In other words, corresponding apertures in the at least two electrodes are aligned with and arranged along a sub-beam path, i.e., one of the sub-beam paths 220. Thus, the electrodes are each provided with apertures through which the respective sub-beam 211, 212, 213 propagates.

The objective lens array 241 may comprise two electrodes, as shown in FIG. 7, or three electrodes, or may have more electrodes (not shown). An objective lens array 241 having only two electrodes can have lower aberration than an objective lens array 241 having more electrodes. A three-electrode objective lens can have greater potential differences between the electrodes and so enable a stronger lens. Additional electrodes (i.e., more than two electrodes) provide additional degrees of freedom for controlling the electron trajectories, e.g., to focus secondary electrons as well as the incident beam. A benefit of two electrode lens over an Einzel lens is that the energy of an in-coming beam is not necessarily the same as an out-going beam. Beneficially the potential differences on such a two-electrode lens array enables it to function as either an accelerating or a decelerating lens array.

Adjacent electrodes of the objective lens array 241 are spaced apart from each other along the sub-beam paths. The distance between adjacent electrodes, in which an insulating structure might be positioned as described below, is larger than an objective lens of the objective lens array.

Preferably, each of the electrodes provided in the objective lens array 241 is a plate. The electrode may otherwise be described as a flat sheet. Preferably, each of the electrodes is planar. In other words, each of the electrodes will preferably be provided as a thin, flat plate, in the form of a plane. Of course, the electrodes are not required to be planar. For example, the electrode may bow due to the force due to the high electrostatic field. It is preferable to provide a planar electrode because this makes manufacturing of the electrodes easier as known fabrication methods can be used. Planar electrodes may also be preferable as they may provide more accurate alignment of apertures between different electrodes.

The objective lens array 241 can be configured to demagnify the charged particle beam by a factor greater than 10, desirably in the range of 50 to 100 or more.

A detector 240 is provided to detect signal particles, i.e., secondary and/or backscattered charged particles, emitted from the sample 208. The detector 240 is positioned between the objective lenses 234 and the sample 208. On direction of a signal particle the detector generates a detection signal. The detector 240 may otherwise be referred to as a detector array or a sensor array, and the terms "detector" and "sensor" are used interchangeably throughout the application.

An electron-optical device for the electron-optical system 41 may be provided. The electron-optical device is configured to project a beam of electrons towards the sample 208. The electron-optical device may comprise the objective lens array 241. The electron-optical device may comprise the detector 240. The array of objective lenses (i.e., the objective lens array 241) may correspond with the array of detectors (i.e., the detector 240) and/or any of the beams (i.e., the sub-beams).

An exemplary detector 240 is described below. However, any reference to the detector 240 could be a single detector (i.e., at least one detector) or multiple detectors as appropriate. The detector 240 may comprise detector elements 405 (e.g., sensor elements such as capture electrodes). The detector 240 may comprise any appropriate type of detector. For example, capture electrodes for example to detect directly electron charge, scintillators or PIN elements can be used. The detector 240 may be a direct current detector or an indirect current detector. The detector 240 may be a detector as described below in relation to FIG. 8.

The detector 240 may be positioned between the objective lens array 241 and the sample 208. The detector 240 is configured to be proximate the sample 208. The detector 240 may be very close to the sample 208. Alternatively, there may be a larger gap from the detector 240 to the sample 208. The detector 240 may be positioned in the device so as to face the sample 208. Alternatively, the detector 240 may be positioned elsewhere in the electron-optical system 41 such that part of the electron-optical device that is not a detector faces the sample 208.

Figure 8:
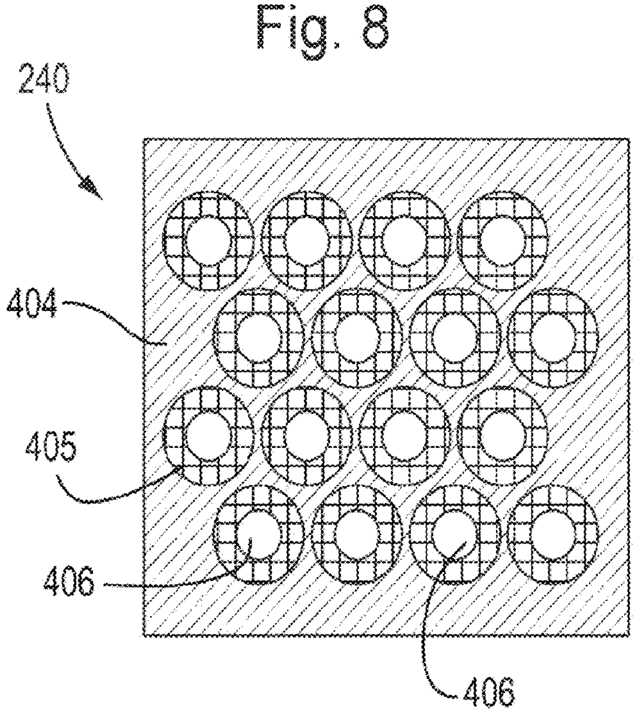
FIG. 8 is a bottom view of a modification of the objective lens array of FIG. 7.

FIG. 8 is a bottom view of the detector 240 which comprises a substrate 404 on which are provided a plurality of detector elements 405 each surrounding a beam aperture 406. The beam apertures 406 may be formed by etching through the substrate 404. In the arrangement shown in FIG. 8, the beam apertures 406 are in a hexagonal close packed array. The beam apertures 406 can also be differently arranged, e.g., in a rectangular, or a rhombic, array. The beam arrangement of the hexagonal arrangement in FIG. 8 may be more densely packed than a square beam arrangement. The detector elements 405 may be arranged in a rectangular array or a hexagonal array. The beam apertures may correspond to the multi-beam arrangement of the sub-beams towards the substrate 404.

Capture electrodes 405 form the bottommost, i.e., most close to the sample, surface of the detector module 240. Between the capture electrodes 405 and the main body of the silicon substrate 404 a logic layer is provided. Logic layer may include amplifiers, e.g., Trans Impedance Amplifiers, analogue to digital converters, and readout logic. In some embodiments, there is one amplifier and one analogue to digital converter per capture electrode 405. A circuit featuring these elements may be comprised in a unit area referred to as a cell that is associated with an aperture. The detector model 240 may have several cells each associated with an aperture. Within or on the substrate is a wiring layer connected to the logic layer and externally connecting the logic layer of each cell for example via power, control, and data lines. The integrated detector module 240 described above is particularly advantageous when used with a system having tunable landing energy as secondary electron capture can be optimized for a range of landing energies. A detector module in the form of an array can also be integrated into other electrode arrays, not only the lowest electrode array. Such a detector module may feature detectors that are scintillators or semiconductor detectors such as PIN detectors, for example above the down-beam most surface of the objective lens. Such detector modules may feature a similar circuit architecture as a detector module comprising a current detector. Further details and alternative arrangements of a detector module integrated into an objective lens can be found in EP application Ser. Nos. 20/184,160.8 and 20217152.6, which document is hereby incorporated by reference at least so far as details of the detector module.

The detector may be provided with multiple portions and more specifically, multiple detecting portions. The detector comprising multiple portions may be associated with one of the sub-beams 211, 212, 213. Thus, the multiple portions of one detector 240 may be configured to detect signal particles emitted from the sample 208 in relation to one of the primary beams (which may otherwise be referred to as sub-beams 211, 212, 213). In other words, the detector comprising multiple portions may be associated with one of the apertures in at least one of the electrodes of the objective lens assembly. More specifically, the detector 405 comprising multiple portions may be arranged around a single aperture 406, which provides an example of such a detector. As mentioned, the detection signal from the detector module is used to generate an image. With multiple detecting portions, the detection signal comprises components from the different detecting signals that may be processed as data sets or in a detection image.

In some embodiments, the objective lens array 241 is an exchangeable module, either on its own or in combination with other elements such as the control lens array and/or detector array. The exchangeable module may be field replaceable, i.e., the module can be swapped for a new module by a field engineer. In some embodiments, multiple exchangeable modules are contained within the system and can be swapped between operable and non-operable positions without opening the electron beam system.

In some embodiments, one or more aberration correctors are provided that reduce one or more aberrations in the sub-beams. Aberration correctors positioned in, or directly adjacent to, the intermediate foci (or intermediate image plane) may comprise deflectors to correct for the source 201 appearing to be at different positions for different beams. Correctors can be used to correct macroscopic aberrations resulting from the source that prevent a good alignment between each sub-beam and a corresponding objective lens. Aberration correctors may correct aberrations that prevent a proper column alignment. Aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference. Aberration correctors may reduce one or more of the following: field curvature; focus error; and astigmatism.

Various different system architectures can be used to perform inspection methods compatible with embodiments of the disclosure. For example, the electron beam system may be a single beam system, or may comprise a plurality of single beam columns or may comprise a plurality of columns of multi-beams. The columns may comprise the electron-optical column 41 described in any of the above embodiments or aspects. As a plurality of columns (or a multi-column system), the devices may be arranged in an array which may number two to one hundred columns or more. The electron beam system may take the form of the examples as described with respect to and depicted in any of FIG. 2-8.

As mentioned in the introductory part of the description, sample assessment methods may be used to assess the extent of undesired pattern defects in a sample. Such methods may involve locating features of interest on the sample and comparing those features to respective reference versions elsewhere on the sample or in a database. An assessment method involving comparison of measured images of features in different die regions may be referred to as a die-to-die (D2D) process. An assessment method involving comparison of a measured image of a feature in a die region with a reference image in a database may be referred to as a die to database (D2DB) process.

In some arrangements, alignment (e.g., for D2DB or D2D) may be done using a sample map that provides information about the locations of field regions and die regions within the field regions. The sample map may be imported from a metrology tool separate from the device that is to perform the sample assessment method (e.g., an optical metrology tool that does not use charged particle beams). Alternatively, the sample map may be generated by measuring the positions of reference marks in dies and using the measured positions to generate the sample map. Such a map is typically generated assuming that the field regions are rectangular and arranged on grid points of a regular rectangular grid. The die regions are also typically rectangular and arranged on grid points of a regular rectangular grid of smaller pitch. Reference marks are measured to determine the position and pitch of the grids. For example, reference marks may be provided that identify positions of respective corners of the die regions (which may be referred to as die corner marks). Field regions may be defined that each contain a group of connected die regions. Each field region may, for example, contain a 2×3 array of die regions.

Deviations between the generated sample map and the actual sample map leads to features of interest not being exactly where they are expected to be during assessment methods. For this reason, assessment methods typically require a search procedure to locate the exact positions of features of interest. The search procedure may comprise searching for selected die marks, such as local alignment points (LAPs). A search region associated with each selected die mark needs to be large enough that the respective die mark and no other die mark is located in the search region. Increasing the size of the search region undesirably increases a length of time necessary to search the search region. Increasing the size of the search region may also increase the risk of the search region including more than one relevant die mark (e.g., LAP), which may risk alignment be performed based on an incorrect die mark.

In practice, exposure of dies on the sample is such that the die regions and field regions are not perfectly rectangular and are not centered exactly on grid points of a regular rectangular grid. These effects arise not only due to limitations in the lithographic apparatus used to perform the exposure, but also because the lithographic apparatus itself applies corrections to minimize process-induced overlay drifting. These corrections include both interfield corrections and intrafield corrections. Interfield corrections may be referred to as wafer grid corrections. Intrafield corrections may be referred to as field grid corrections. Information about corrections applied during exposures may be output as exposure correction data (see below).

Interfield corrections are applied to correct the positions of field regions on the sample. The positions may need to be corrected due to distortion of the sample. Various process steps may cause distortion in the sample. Distortion may arise from chemical mechanical polishing and/or thermal annealing. Distortion may arise due to changes in an overall shape of the sample due to mechanical stresses on the wafer and/or be caused by transferring the wafer between different supports. Interfield corrections are applied by the lithographic apparatus to compensate for such distortion. The interfield corrections may involve higher order corrections, such as corrections based on $3^{rd}$ to $5^{th}$ order fittings (e.g., based on $3^{rd}$ to $5^{th}$ order polynomials). The lithographic apparatus exposes the field regions according to the corrected positions of the field regions (after application of the interfield corrections).

Intrafield corrections are applied to correct each field shape. During exposure, the field shape may be deformed due to various factors, such as image settings, lens heating and reticle stage drifting. Typically, a $3^{rd}$ to $5^{th}$ order fitting is applied to represent deformation of the field shape. The lithographic apparatus may tune the lens or reticle stage to ensure each field region is exposed while taking the corrections into account. Due to constraints in scanning and/or in the exposure slit of the lithographic apparatus, some of the intrafield corrections will be neglected during exposure.

The complex non-linear deviations in position and/or shape of the field regions that arise in practice can lead to large mismatches between the positions of relevant die marks (e.g., LAPs) and their expected positions in a sample map generated based on a simple model of die regions and field regions being in a regular array of rectangular elements. The large position mismatches decrease throughput and reliability in assessment methods. The mismatches are particularly problematic where it is desired to perform an offline setup procedure before a sample is available for measurement (sometimes referred to as a wafer-less offline recipe setup). The mismatches mean that a series of manual recipe adjustments needs to be performed when the sample is available, which reduces the utility of the offline setup procedure.

Embodiments described below aim to at least partially address one or more of the challenges described above.

Figure 9:
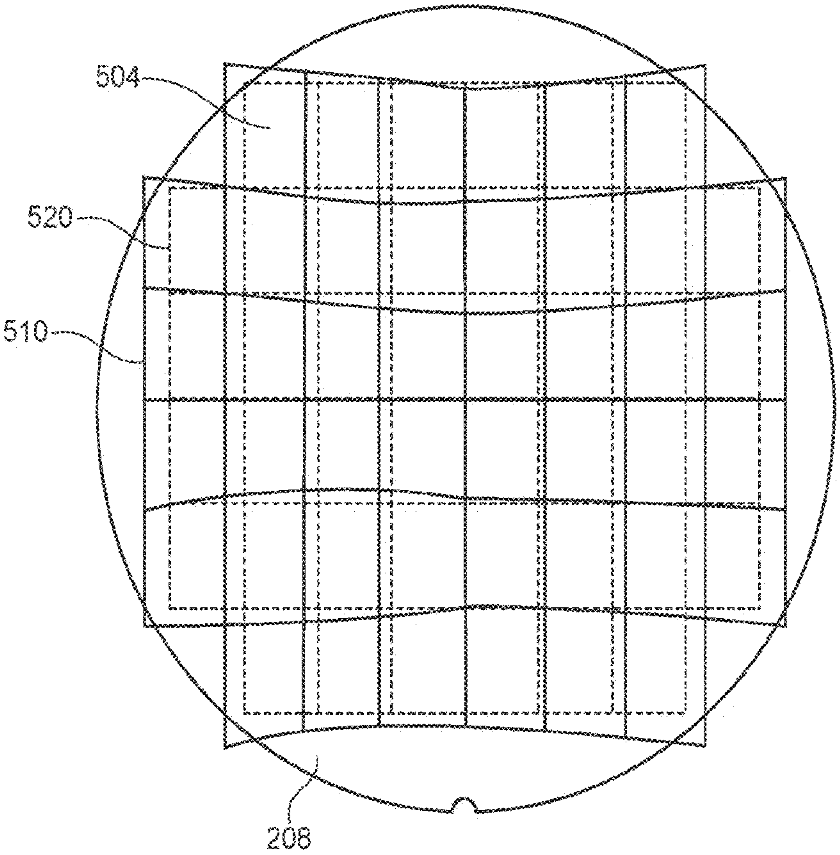
FIG. 9 depicts a sample with an actual sample map and a generated sample map, the generated sample map being based on rectangular field regions positioned on grid points of a perfect rectangular grid.
Figure 11:
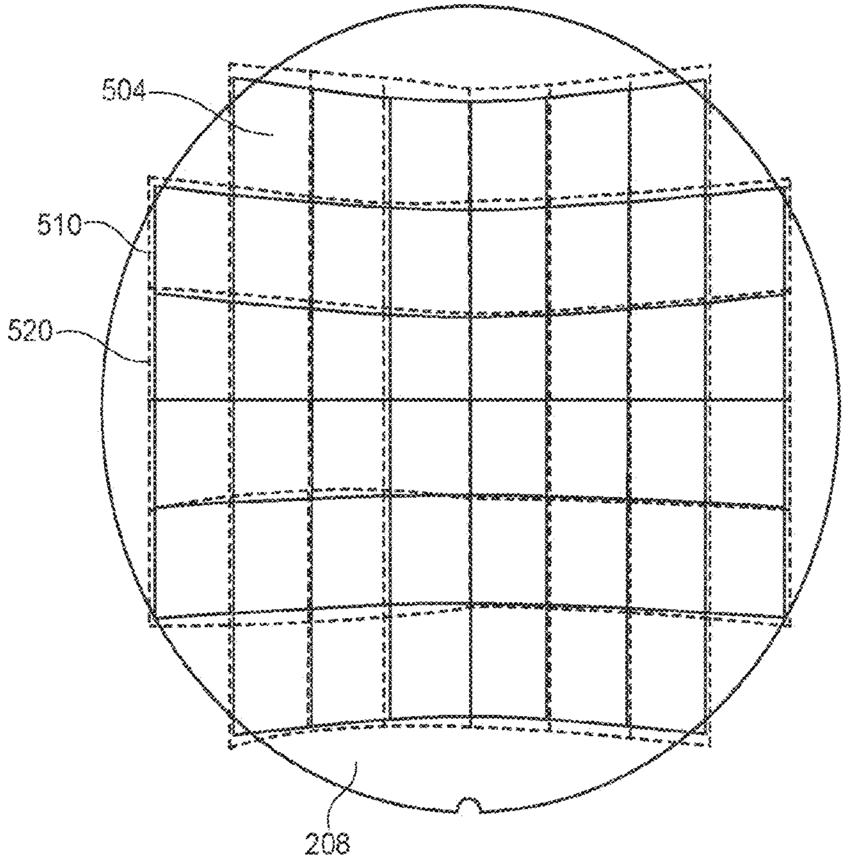
FIG. 11 depicts a sample with an actual sample map and a generated sample map, the generated sample map being based on a model capable of representing non-linear geometries.

FIGS. 9 and 11 depict a sample 208 that has been processed by a lithographic apparatus to define a pattern on the sample 208. The sample 208 is processed in a plurality of die regions 502 (not shown) and field regions 504. Each die region 502 may correspond for example to a respective die in a pattern defined by the lithographic process. Each field region 504 may correspond to a region processed by a respective exposure of the sample 208 during the lithographic process. Each field region 504 contains or consists of a plurality of the die regions 502. In the example discussed below with reference to FIG. 14, each field region 504 contains a 2×3 array of die regions 502.

As discussed above, various factors lead to positions and shapes of field regions 504 being distorted such that an actual sample map representing positions and shapes of field regions 504 is significantly different to a nominal sample map. A schematic example of an actual sample map of field regions 504 is depicted by the solid line grid labelled 510 in FIGS. 9 and 11. The solid lines in the grid represent boundaries of the field regions 504. Each field region 504 contains plural die regions 502 but these are not shown.

As discussed above, a sample map of field regions may be generated based on measurements of reference marks in die regions. Example of such generated sample maps are depicted by the broken line grids labelled 520 in FIGS. 9 and 11.

Figure 10:
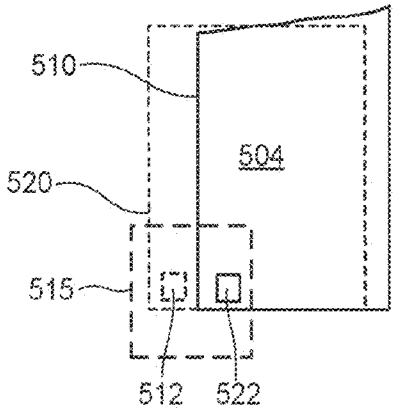
FIG. 10 depicts example actual and generated field regions in the arrangement of FIG. 9.

FIG. 9 depicts the case where the sample map is generated assuming that the field regions 504 are rectangular and positioned on grid points of a regular rectangular array. FIG. 10 depicts an exemplary one of the field regions 504 of FIG. 9, with the solid line boundary labelled 510 representing the actual position and shape of the field region 504 and the broken line boundary labelled 520 representing the position and shape of the field region 504 according to the generated sample map. When the sample map is generated in this way, it can be seen that there is a large mismatch between the actual position and shape of the field region 504 and the position and shape of the field region 504 predicted by the generated sample map. As shown in FIG. 10, in a subsequent alignment process a search region 515 for searching for a selected die mark (e.g., LAP) needs to be relatively large to reliably capture the die mark. This is because the predicted position 512 of the die mark according to the generated map is relatively far from the actual position 522 of the die mark.

Figure 12:
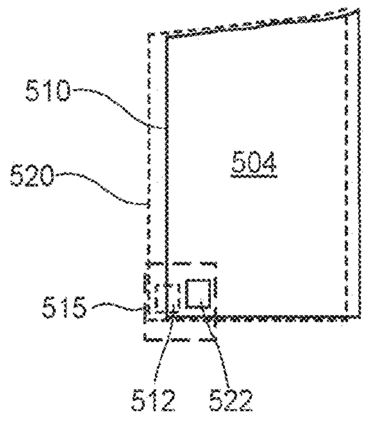
FIG. 12 depicts example actual and generated field regions in the arrangement of FIG. 11.

FIG. 11 depicts the case where the sample map is generated using methods of the present disclosure. These methods allow for more complex arrangements of the field regions 504 on the sample 208, thereby allowing a closer match between the generated sample map and reality. FIG. 12 depicts an exemplary one of the field regions 504 of FIG. 11, with the solid line boundary labelled 510 representing the actual position and shape of the field region 504 and the broken line boundary labelled 520 representing the position and shape of the field region 504 according to the generated sample map. In comparison to the situation shown in FIGS. 9 and 10, it can be seen that the generated sample map provides a much closer match to reality in the arrangement of FIGS. 11 and 12. As a consequence, the search region 515 can be much smaller while still reliably capturing die marks used for alignment.

An example method for achieving the above functionality is described below with reference to FIGS. 13 and 14. The method generates a sample map. The sample map defines positions and shapes of field regions. The method may be performed by a charged particle inspection system such as that discussed above with reference to FIG. 1. The charged particle inspection system may comprise an electron beam system 40. The electron beam system 40 projects one or more electron beams onto a sample 208 and detects signal electrons emitted from the sample 208 in order to obtain information about the surface of the sample 208, such as an image representing characteristics of a material structure of the surface. The electron beam system 40 may take any of the forms discussed above with reference to FIG. 2-8 or other forms.

A sample 208 is provided that has been processed by a lithographic process as described above. The sample 208 comprises die regions 502 (e.g., dies). The die regions 502 are distributed between a plurality of field regions 504 (e.g., fields). Each field region 504 contains a plurality of the die regions 502.

Figure 13:
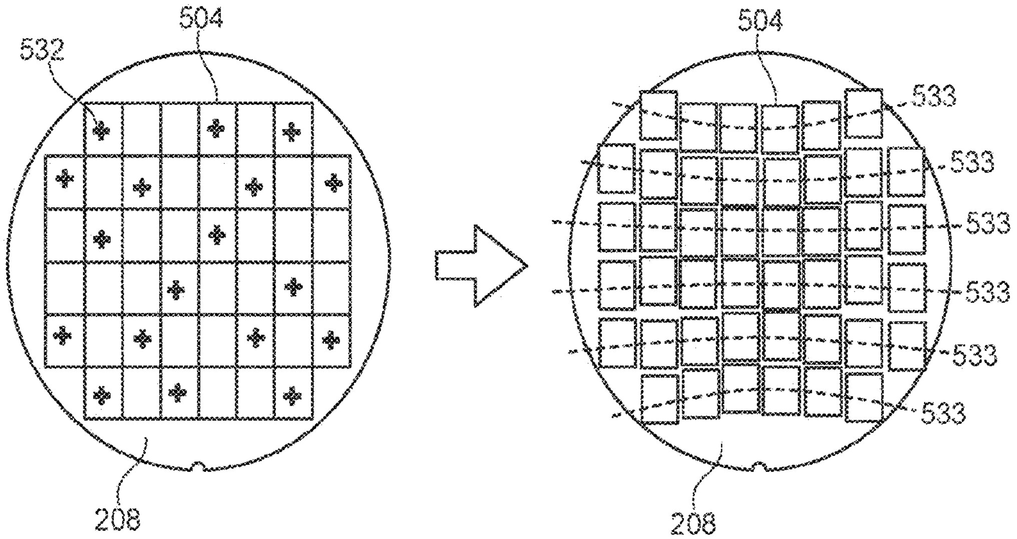
FIG. 13 depicts measuring of positions of first marks on a sample (left) and fitting of a first model to the measured positions (right) to represent positions of field regions.

As depicted schematically in FIG. 13 (left part), the method further comprises measuring a position of a first mark 532 in each of a plurality of field regions 504. The positions of the first marks may be measured relative to a common reference position on the sample 208, such as a geometrical center of the sample 208 (e.g., the center of a wafer). The first marks 532 are depicted schematically as crosses and shown relative to a nominal (undeformed) arrangement of field regions 504 on a sample 208.

The method further comprises fitting a first model to the measured positions of the first marks 532. The fitted first model represents positions of the field regions 504. The represented positions are shown schematically in FIG. 13 (right part).

Figure 14:
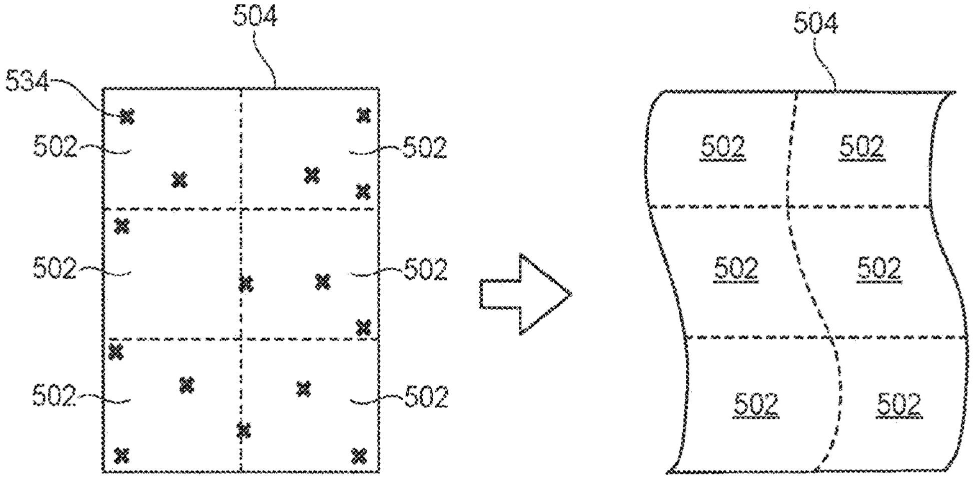
FIG. 14 depicts measuring of positions of second marks in a field region (left) and fitting of a second model to the measured positions to represent a shape of a field region (right).

As depicted schematically in FIG. 14 (left part), the method further comprises measuring positions of a plurality of second marks 534 in one field region 504 or in each of a plurality of field regions 504. The positions of the second marks in each field region 504 may be measured relative to a reference point specific to that field region 504, such as relative to a geometrical center of the field region 504.

The method further comprises fitting a second model to the measured positions of the second marks 534. The fitted second model represents a shape of each field region 504. An example represented shape of one of the field regions 504 is shown in FIG. 14 (right part). The second marks 534 may be measured in multiple field regions 504. The fitting of the second model may comprise independently determining the shapes of multiple different field regions 504 using the second marks within them. Thus, different field regions 504 may be determined to have different shapes. For example, in some embodiments the second marks are measured in each of 3-10 field regions 504, optionally in each of 3-6 field regions 504, optionally in each of 3-4 field regions 504. The number of second marks measured in each of these field regions 504 may be in the range of 5-20, optionally in the range of 8-18, optionally in the range of 10-15. The measured second marks may be used to independently determine the shapes of these field regions 504. An average of the determined shapes may be determined and applied to all of the field regions 504 in the map as an approximation. In this case, the second model may represent shapes of the field regions 504 as all being the same as each other. In other embodiments, the fitted second model represents different shapes for different field regions 504.

The method further comprises outputting a sample map using the fitted first and second models. Thus, the representations of the positions of the field regions 504 provided by the fitted first model are combined with the representations of the shapes of the field regions 504 provided by the fitted second model to provide a sample map.

Either or both of the first model and the second model is/are configured to represent non-linear geometries. Thus, in contrast to the situation discussed above with reference to FIGS. 9 and 10 where a map was generated assuming that the die regions 502 and field regions 504 are rectangular and arranged on grid points of a regular rectangular grid, the first model and/or the second model are provided with greater degrees of freedom, thereby allowing better matching between the generated sample map and reality.

In some embodiments, the first model is configured to represent the positions of the field regions 504 in an array having rows of field regions 504 and columns of field regions 504. At least one of the rows is non-linear and/or at least one of the columns is non-linear. In a non-linear row, field regions 504 in the row will be aligned along a row line that is non-linear. The row line may be defined as a line passing through the geometrical centers of the field regions 504 in the row. Example row lines 533 are shown schematically in FIG. 13 (right part). Similarly, in a non-linear column, field regions 504 in the column will be aligned along a column line (not shown) that is non-linear. Intersections between row lines and column lines may define positions of the field regions 504 in the array, such as positions of geometrical centers of the field regions 504. Providing the first model with enough degrees of freedom to allow the row lines and/or column lines to be non-linear improves the accuracy with which the first model can describe the positions of the field regions 504.

Various mathematical structures may be used to define the first model. In one example, the first model comprises a plurality of equations that define the row lines and column lines. Thus, the first model may represent each non-linear row and/or non-linear column with a respective non-linear equation. In some embodiments, the equations are polynomials of degree equal to 2 or higher. Optionally, the degree of the polynomial equations is in the range of 3-5 inclusive. This has been found to provide a good balance between precision of fitting and sampling throughput. A general expression for a polynomial $f(x)$ is as follows, where the degree is the largest value of k for which there is a non-zero value for the corresponding coefficient $\alpha_k$:

$$f(x) = \sum_{k=0}^{n} a_k x^k.$$

The coefficients of each equation (e.g., the values of $a_k$ in the polynomial example given above) define the exact shape and position of the line that the equation represents. Each first mark has a known position relative to the field region 504 in which the first mark is located. The fitting of the first model to the measured positions of the first marks can thus be performed by determining the coefficients of the equations that result in the field regions 504 being positioned in the generated sample map such the first marks within them are as close as possible on average to the respective measured positions. Other representations of curves are possible, such as spline representations.

Similar considerations apply to the second model. The second model may be configured to represent a shape of each field region 504 such that at least a portion of a boundary of the shape is non-linear, as exemplified in FIG. 14 (right part). The second model may represent each non-linear portion of a boundary with a respective non-linear equation. The non-linear equation may take any of the forms described above for the first model, including a polynomial of degree 2 or higher (optionally in the range of 3-5 inclusive).

In some embodiments, the measurement of the positions of the second marks is performed using the positions of the field regions 504 represented by the fitted first model. The improved map of field region positions provided by the fitted first model can facilitate location of the second marks, thereby improving the speed and/or reliability of measurement of the positions of the second marks.

Figure 15:
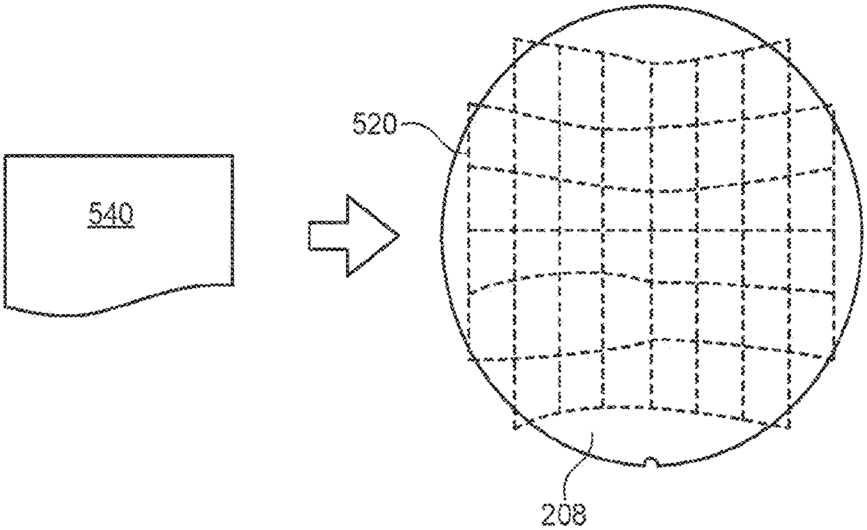
FIG. 15 depicts generation of a sample map using exposure correction data from a lithographic apparatus.
Figure 16:
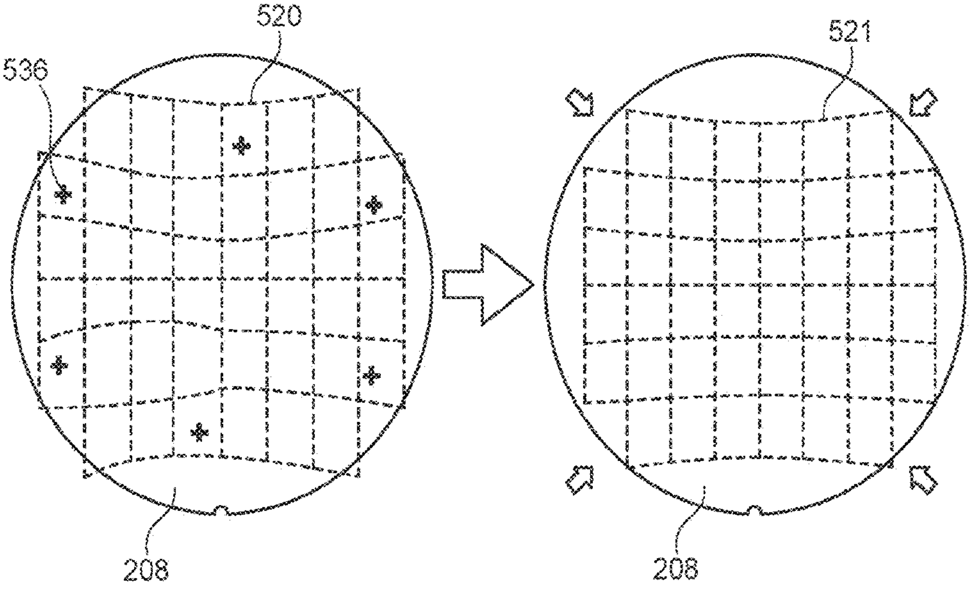
FIG. 16 depicts fine tuning of the sample map generated in FIG. 15, with FIG. 16 (left) showing measurement of positions of a plurality of reference marks and FIG. 16 (right) showing application of a linear correction to the generated sample map of FIG. 15 based on the reference marks measured in FIG. 16 (left).

FIGS. 15 and 16 schematically depict a further method that can be used in combination with or instead of the method described above with reference to FIG. 11-14. This method again comprises generating a sample map representing positions and shapes of field regions, as indicated schematically by broken line grid 520. The sample 208 may comprise field regions 504 and die regions 502 in any of the configurations discussed above. The present method further comprises receiving exposure correction data 540 from a lithographic apparatus used to expose each of the field regions 504 in a lithographic process. The method comprises using the exposure correction data 540 to generate the sample map.

As described above, the lithographic apparatus will typically apply various complex (non-linear) corrections to the positions and/or shapes of die regions on the sample. The exposure correction data 540 contains information about these corrections and thereby provides information about expected positions and shapes of the field regions 504. The exposure correction data may include information about any of the interfield and intrafield corrections discussed above and/or any other corrections that affect the positions and/or shapes of the field regions 504. The exposure correction data 540 makes it possible to generate a sample map (as exemplified in FIG. 15 (right part)) that is closer to reality that alternative methods that assume the field regions 504 are rectangular and positioned on grid points of a regular rectangular array (as exemplified in FIGS. 9 and 10 discussed above). The positions and/or shapes of the field regions 504 may be defined in any of the ways described above with reference to FIG. 11-14. The positions of the field regions 502 may be defined in an array having rows of field regions and columns of field regions, wherein at least one of the rows is non-linear and/or at least one of the columns is non-linear. The defined shapes of the field regions 505 may include boundaries having non-linear portions.

In some embodiments, as exemplified in FIG. 16, the method further comprises applying a correction to the sample map generated using the received exposure correction data (represented by the grid 520 in the left part of FIG. 16) to obtain a corrected sample map (represented by the grid 521 shown in the right part of FIG. 16). Such a correction may be required due to process drifts or warpage of the sample 208 for example. There may also be differences between spatial measurement systems used in the lithographic apparatus in comparison to spatial measurement systems used in an assessment apparatus that will use the generated sample map to assess defects. In some embodiments, the method comprises measuring positions of a plurality of reference marks 536 on the sample 208 and using the measured positions to generate the corrected sample map. The corrected sample map may be such as to minimize an average difference between the positions of the reference marks in the generated sample map and the actual positions of the reference marks on the sample 208. The radially inward directed arrows in the right part of FIG. 16 schematically depict the correction, which in this example includes a general radial shrinking of the grid to achieve the improved matching to the measured positions of the reference marks.

In some embodiments, the corrected map is generated by linearly adjusting the sample map generated using the exposure correction data to achieve the improved matching to the measured positions of the reference marks. The linear adjustment may, for example, comprise increasing or decreasing a size of the generated sample map without changing the geometry (e.g., aspect ratio) of the generated sample map. The number of reference marks 536 can be chosen relatively freely. In some embodiments, a linear model using 6-10 reference marks 536 has been found to provide good performance. Higher order corrections could alternatively be applied, but the inventors have found that linear adjustment for this particular type of correction provides satisfactory performance in many scenarios. This is because information about the complex non-linear distortions of the grid has already been provided in the initially sample map generated based on the received exposure correction data.

In some embodiments, information about the corrected map is provided to the lithographic apparatus as feedback. This enables subsequent lithographic processes to be adapted to reduce errors in the lithographic processes. For example, if the corrected sample map indicates that an offset is drifting this may provide information about instabilities in the lithographic process. In some embodiments, the lithographic apparatus adapts process parameters based on the corrected sample map to improve performance of the lithographic apparatus. The adaptations may reduce the need for corrections to generated sample maps in the future. A method of processing a sample may thus be provided that comprises generating a corrected sample map using any of the techniques described above and adapting a lithographic process performed on a subsequent sample using the generated corrected map.

In some embodiments, an assessment method is provided that comprises generating a sample map according to any of the methods described above. The assessment method comprises inspecting the sample 208 using the generated sample map to locate one or more features of interest. The assessment method may comprise assessing the extent to which the one or more features of interest contain defects. This may be achieved by comparing images of the features of interest with reference images elsewhere on the sample, on other samples, or in a database.

In some embodiments, the inspection is performed by directing one or more beams of charged particles (e.g., electrons) onto the sample 208 and detecting one or more charged particles (e.g., electrons) emitted from the sample 208. The inspection may use any of the electron-optical arrangements described above with reference to FIG. 1-8 or any other suitable arrangement for inspecting a sample using a beam of charged particles. The inspection may also be performed using other techniques, such as optical techniques based on electromagnetic radiation.

References to upper and lower, up and down, above and below, etc. should be understood as referring to directions parallel to the (typically but not always vertical) up-beam and down-beam directions of the electron beam or multi-beam impinging on the sample 208. Thus, references to up beam and down beam are intended to refer to directions in respect of the beam path independently of any present gravitational field.

The embodiments herein described may take the form of a series of aperture arrays or electron-optical elements arranged in arrays along a beam or a multi-beam path. Such electron-optical elements may be electrostatic. In some embodiments, all the electron-optical elements, for example from a beam limiting aperture array to a last electron-optical element in a sub-beam path before a sample, may be electrostatic and/or may be in the form of an aperture array or a plate array. In some arrangements one or more of the electron-optical elements are manufactured as a microelectromechanical system (MEMS) (i.e., using MEMS manufacturing techniques). Electron-optical elements may have magnetic elements and electrostatic elements. For example, a compound array lens may feature a macro magnetic lens encompassing the multi-beam path with an upper and lower pole plate within the magnetic lens and arranged along the multi-beam path. In the pole plates may be an array of apertures for the beam paths of the multi-beam. Electrodes may be present above, below or between the pole plates to control and optimize the electro-magnetic field of the compound lens array.

An assessment tool or assessment system according to the disclosure may comprise apparatus which makes a qualitative assessment of a sample (e.g., pass/fail), one which makes a quantitative measurement (e.g., the size of a feature) of a sample or one which generates an image of map of a sample. Examples of assessment tools or systems are inspection tools (e.g., for identifying defects), review tools (e.g., for classifying defects) and metrology tools, or tools capable of performing any combination of assessment functionalities associated with inspection tools, review tools, or metrology tools (e.g., metro-inspection tools).

Reference to a component or system of components or elements being controllable to manipulate a charged particle beam in a certain manner includes configuring a controller or control system or control unit to control the component to manipulate the charged particle beam in the manner described, as well optionally using other controllers or devices (e.g., voltage supplies) to control the component to manipulate the charged particle beam in this manner. For example, a voltage supply may be electrically connected to one or more components to apply potentials to the components, such as to the electrodes of the control lens array 250 and objective lens array 241, under the control of the controller or control system or control unit. An actuatable component, such as a stage, may be controllable to actuate and thus move relative to other components such as the beam path using one or more controllers, control systems, or control units to control the actuation of the component.

Functionality provided by the controller or control system or control unit may be computer-implemented. Any suitable combination of elements may be used to provide the required functionality, including for example CPUs, RAM, SSDs, motherboards, network connections, firmware, software, and/or other elements known in the art that allow the required computing operations to be performed. The required computing operations may be defined by one or more computer programs. The one or more computer programs may be provided in the form of media, optionally non-transitory media, storing computer readable instructions. The media may be referred to as computer program products. When the computer readable instructions are read by the computer, the computer performs the required method steps. The computer may consist of a self-contained unit or a distributed computing system having plural different computers connected to each other via a network.

The terms “sub-beam” and “beamlet” are used interchangeably herein and are both understood to encompass any radiation beam derived from a parent radiation beam by dividing or splitting the parent radiation beam. The term “manipulator” is used to encompass any element which affects the path of a sub-beam or beamlet, such as a lens or deflector. References to elements being aligned along a beam path or sub-beam path are understood to mean that the respective elements are positioned along the beam path or sub-beam path. References to optics are understood to mean electron-optics.

The methods of the present disclosure may be performed by computer systems comprising one or more computers. A computer used to implement the embodiments of the present disclosure may comprise one or more processors, including general purpose CPUs, graphical processing units (GPUs), Field Programmable Gate Arrays (FPGAs), Application Specific Integrated Circuits (ASICs) or other specialized processors. As discussed above, in some cases specific types of processors may provide advantages in terms of reduced cost and/or increased processing speed and the method of the embodiments of the present disclosure may be adapted to the use of specific processor types. Certain steps of methods of the present disclosure involve parallel computations that are apt to be implemented on processers capable of parallel computation, for example GPUs.

The term “image” used herein is intended to refer to any array of values wherein each value relates to a sample of a location and the arrangement of values in the array corresponds to a spatial arrangement of the sampled locations. An image may comprise a single layer or multiple layers. In the case of a multi-layer image, each layer, which may also be referred to as a channel, represents a different sample of the locations. The term “pixel” is intended to refer to a single value of the array or, in the case of a multi-layer image, a group of values corresponding to a single location.

A computer used to implement the embodiments of the present disclosure may be physical or virtual. A computer used to implement the embodiments of the present disclosure may be a server, a client, or a workstation. Multiple computers used to implement the embodiments of the present disclosure may be distributed and interconnected via a local area network (LAN) or wide area network (WAN). Results of a method of the embodiments of the present disclosure may be displayed to a user or stored in any suitable storage medium. The present disclosure may be embodied in a non-transitory computer-readable storage medium storing instructions to carry out the disclosed methods and implementations thereof. The present disclosure may be embodied in computer system comprising one or more processors and memory or storage storing instructions to carry out the disclosed methods and implementations thereof.

Various embodiments of the disclosure are defined in the following numbered clauses.

1. A method of generating a sample map, the method comprising:
   obtaining a sample having field regions;
   measuring a position of a first mark in each of a plurality of the field regions;
   fitting a first model to the measured positions of the first marks, the fitted first model representing positions of the field regions;
   measuring positions of a plurality of second marks in one field region or in each of a plurality of field regions;
   fitting a second model to the measured positions of the second marks, the fitted second model representing a shape of each field region; and
   outputting a sample map using the fitted first and second models.
2. The method of clause 1, wherein either or both of the first and second models is/are configured to represent non-linear geometries.
3. The method of clause 1 or 2, wherein the measurement of the positions of the second marks is performed using the positions of the field regions represented by the fitted first model.
4. The method of any preceding clause, wherein the first model is configured to represent the positions of the field regions in an array having rows of field regions and columns of field regions, wherein at least one of the rows is non-linear and/or at least one of the columns is non-linear.

5. The method of any preceding clause, wherein the second model is configured to represent a shape of each field region such that at least a portion of a boundary of the shape is non-linear.
6. The method of clause 4, wherein the first model represents each non-linear row and/or non-linear column with a respective non-linear equation.
7. The method of clause 5, wherein the second model represents each non-linear portion of a boundary with a respective non-linear equation.
8. The method of clause 6 or 7, wherein each non-linear equation comprises a polynomial equation.
9. The method of clause 8, wherein the degree of the polynomial equation is in the range of 3-5 inclusive.
10. The method of any preceding clause, wherein the positions of the first marks are measured relative to a common reference position on the sample.
11. The method of any preceding clause, wherein the positions of the second marks in each field region are measured relative to a reference point specific to that field region.
12. The method of any preceding clause, wherein each field region corresponds to a region processed by a respective exposure of the sample during a lithographic process.
13. The method of any preceding clause, wherein the second marks are measured in each of 3-10 field regions.
14. The method of any preceding clause, wherein the positions of 5-20 second marks are measured in the one field region or in each of the plurality of field regions.
15. A method of generating a sample map, wherein the sample map comprises information about positions and shapes of field regions on the sample, the method comprising:
providing a sample having field regions;
receiving exposure correction data from a lithographic apparatus used to expose each of the field regions; and
using the exposure correction data to generate the sample map.
16. The method of clause 15, wherein the sample map defines the positions of the field regions in an array having rows of field regions and columns of field regions, wherein at least one of the rows is non-linear and/or at least one of the columns is non-linear.
17. The method of clause 16, wherein the sample map defines shapes of the field regions that include boundaries having non-linear portions.
18. The method of any of clauses 15-17, further comprising measuring positions of a plurality of reference marks on the sample and using the measured positions to generate a corrected sample map.
19. The method of clause 18, wherein the corrected sample map is generated by linearly adjusting the sample map generated using the exposure correction data.
20. The method of clause 18 or 19, further comprising providing information about the corrected sample map to a lithographic apparatus to enable a subsequent lithographic process to be adapted to reduce errors in the lithographic process.
21. A computer program product comprising instructions which, when the program is executed by a computer, cause the computer to carry out the following steps:
receiving data representing a measured position of a first mark in each of a plurality of field regions on a sample;
fitting a first model to the measured positions of the first marks, the fitted first model representing positions of the field regions;
receiving data representing measured positions of a plurality of second marks in one field region or in each of a plurality of field regions;
fitting a second model to the measured positions of the second marks, the fitted second model representing a shape of each field region; and
outputting a sample map using the fitted first and second models.
22. The computer program product of clause 21, wherein either or both of the first and second models is/are configured to represent non-linear geometries.
23. The computer program product of clause 21 or 22, wherein the measurement of the positions of the second marks is performed using the positions of the field regions represented by the fitted first model.
24. The computer program product of any of clauses 21-23, wherein the first model is configured to represent the positions of the field regions in an array having rows of field regions and columns of field regions, wherein at least one of the rows is non-linear and/or at least one of the columns is non-linear.
25. The computer program product of any of clauses 21-24, wherein the second model is configured to represent a shape of each field region such that at least a portion of a boundary of the shape is non-linear.
26. The computer program product of clause 24, wherein the first model represents each non-linear row and/or non-linear column with a respective non-linear equation.
27. The computer program product of clause 25, wherein the second model represents each non-linear portion of a boundary with a respective non-linear equation.
28. The computer program product of clause 26 or 27, wherein each non-linear equation comprises a polynomial equation.
29. The computer program product of clause 28, wherein the degree of the polynomial equation is in the range of 3-5 inclusive.
30. The computer program product of any of clauses 21-29, wherein the measured positions of the first marks represent positions measured relative to a common reference position on the sample.
31. The computer program product of any of clauses 21-30, wherein the measured positions of the second marks in each field region represent positions measured relative to a reference point specific to that field region.
32. The computer program product of any of clauses 21-31, wherein each field region corresponds to a region processed by a respective exposure of the sample during a lithographic process.
33. The computer program product of any of clauses 21-32, wherein the received data representing measured positions of the second marks includes measured positions of second marks in each of 3-10 field regions.
34. The computer program product of any of clauses 21-33, wherein the received data representing measured positions of the second marks includes positions of 5-20 second marks measured in the one field region or in each of the plurality of field regions.

35. A computer program product comprising instructions which, when the program is executed by a computer, cause the computer to carry out the following steps:
receiving exposure correction data from a lithographic apparatus used to expose field regions on a sample; and
using the exposure correction data to generate a sample map comprising information about positions and shapes of field regions on the sample.
36. The computer program product of clause 35, wherein the sample map defines the positions of the field regions in an array having rows of field regions and columns of field regions, wherein at least one of the rows is non-linear and/or at least one of the columns is non-linear.
37. The computer program product of clause 36, wherein the sample map defines shapes of the field regions that include boundaries having non-linear portions.
38. The computer program product of any of clauses 35-37, further comprising instructions which, when the program is executed by the computer, cause the computer to:
receive data representing measured positions of a plurality of reference marks on the sample and use the measured positions to generate a corrected sample map.
39. The computer program product of clause 38, wherein the corrected sample map is generated by linearly adjusting the sample map generated using the exposure correction data.
40. The computer program product of clause 38 or 39, further comprising instructions which, when the program is executed by the computer, cause the computer to:
provide information about the corrected sample map to a lithographic apparatus to enable a subsequent lithographic process to be adapted to reduce errors in the lithographic process.
41. A charged particle beam inspection system, comprising:
a sample holder configured to hold a sample having field regions;
an electron beam system configured to project one or more electron beams onto the sample and to detect signal electrons emitted from the sample; and
a controller configured to:
cause the electron beam system to measure a position of a first mark in each of a plurality of the field regions;
fit a first model to the measured positions of the first marks, the fitted first model representing positions of the field regions;
cause the electron beam system to measure positions of a plurality of second marks in one field region or in each of a plurality of field regions;
fit a second model to the measured positions of the second marks, the fitted second model representing a shape of each field region; and
output a sample map using the fitted first and second models.
42. The system of clause 41, wherein either or both of the first and second models is/are configured to represent non-linear geometries.
43. The system of clause 41 or 42, wherein the controller is configured to cause the electron beam system to measure the positions of the second marks using the positions of the field regions represented by the fitted first model.
44. The system of any of clauses 41-43, wherein the first model is configured to represent the positions of the field regions in an array having rows of field regions and columns of field regions, wherein at least one of the rows is non-linear and/or at least one of the columns is non-linear.
45. The system of any of clauses 41-44, wherein the second model is configured to represent a shape of each field region such that at least a portion of a boundary of the shape is non-linear.
46. The system of clause 44, wherein the first model represents each non-linear row and/or non-linear column with a respective non-linear equation.
47. The system of clause 45, wherein the second model represents each non-linear portion of a boundary with a respective non-linear equation.
48. The system of clause 46 or 47, wherein each non-linear equation comprises a polynomial equation.
49. The system of clause 48, wherein the degree of the polynomial equation is in the range of 3-5 inclusive.
50. The system of any of clauses 41-49, wherein the controller is configured to cause the electron beam system to measure the positions of the first marks relative to a common reference position on the sample.
51. The system of any of clauses 41-50, wherein the controller is configured to cause the electron beam system to measure the positions of the second marks in each field region relative to a reference point specific to that field region.
52. The system of any of clauses 41-51, wherein each field region corresponds to a region processed by a respective exposure of the sample during a lithographic process.
53. The system of any of clauses 41-52, wherein the controller is configured to cause the electron beam system to measure the second marks in each of 3-10 field regions.
54. The system of any of clauses 41-53, wherein the controller is configured to cause the electron beam system to measure positions of 5-20 second marks in the one field region or in each of the plurality of field regions.
55. A charged particle beam inspection system, comprising:
a sample holder configured to hold a sample having field regions;
an electron beam system configured to project one or more electron beams onto the sample and to detect signal electrons emitted from the sample; and
a controller configured to:
receive exposure correction data from a lithographic apparatus used to expose field regions on a sample; and
use the exposure correction data to generate a sample map comprising information about positions and shapes of field regions on the sample.
56. The system of clause 55, wherein the sample map defines the positions of the field regions in an array having rows of field regions and columns of field regions, wherein at least one of the rows is non-linear and/or at least one of the columns is non-linear.
57. The system of clause 56, wherein the sample map defines shapes of the field regions that include boundaries having non-linear portions.
58. The system of any of clauses 55-57, wherein the controller is configured to cause the electron beam system to measure positions of a plurality of reference marks on the sample and to use the measured positions to generate a corrected sample map.

59. The system of clause 58, wherein the controller is configured to generate the corrected sample map by linearly adjusting the sample map generated using the exposure correction data.

60. The system of clause 58 or 59, wherein the controller is configured to provide information about the corrected sample map to a lithographic apparatus to enable a subsequent lithographic process to be adapted to reduce errors in the lithographic process.

61. A method of processing a sample, comprising:
generating a corrected sample map using the method of any of clauses 18-20; and
adapting a lithographic process performed on a subsequent sample using the generated corrected sample map.

62. An assessment method, comprising:
generating a sample map using the method of any of clauses 1-20; and
inspecting the sample using the generated sample map to locate one or more features of interest.

63. The method of clause 62, wherein the inspection is performed by directing one or more beams of charged particles onto the sample and detecting one or more charged particles emitted from the sample.

While the embodiments of the present disclosure have been described in connection with various examples, other embodiments consistent with the present disclosure will be apparent to those skilled in the art from consideration of the specification and practice disclosed herein. It is intended that the specification and examples be considered as exemplary only.

The invention claimed is:

1. A method of generating a sample map, the method comprising:
obtaining a sample having field regions;
measuring a position of a first mark in each of a plurality of the field regions;
fitting a first model to the measured positions of the first marks, the fitted first model representing positions of the field regions;
measuring positions of a plurality of second marks in one field region or in each of a plurality of field regions;
fitting a second model to the measured positions of the second marks, the fitted second model representing a shape of each field region; and
outputting a sample map using the fitted first and second models.

2. The method of claim 1, wherein either or both of the first and second models is/are configured to represent non-linear geometries.

3. The method of claim 1, wherein the measurement of the positions of the second marks is performed using the positions of the field regions represented by the fitted first model.

4. The method of claim 1, wherein the first model is configured to represent the positions of the field regions in an array having rows of field regions and columns of field regions, wherein at least one of the rows is non-linear and/or at least one of the columns is non-linear.

5. The method of claim 4, wherein the first model represents each non-linear row and/or non-linear column with a respective non-linear equation.

6. The method of claim 5, wherein each non-linear equation comprises a polynomial equation.

7. The method of claim 6, wherein the degree of the polynomial equation is in the range of 3-5 inclusive.

8. The method of claim 1, wherein the second model is configured to represent a shape of each field region such that at least a portion of a boundary of the shape is non-linear.

9. The method of claim 8, wherein the second model represents each non-linear portion of a boundary with a respective non-linear equation.

10. The method of claim 1, wherein the positions of the first marks are measured relative to a common reference position on the sample.

11. The method of claim 1, wherein the positions of the second marks in each field region are measured relative to a reference point specific to that field region.

12. The method of claim 1, wherein each field region corresponds to a region processed by a respective exposure of the sample during a lithographic process.

13. The method of claim 1, wherein the second marks are measured in each of 3-10 field regions.

14. The method of claim 1, wherein the positions of 5-20 second marks are measured in the one field region or in each of the plurality of field regions.

15. A computer program product comprising instructions which, when the program is executed by a computer, cause the computer to perform operations comprising:
receiving data representing a measured position of a first mark in each of a plurality of field regions on a sample;
fitting a first model to the measured positions of the first marks, the fitted first model representing positions of the field regions;
receiving data representing measured positions of a plurality of second marks in one field region or in each of a plurality of field regions;
fitting a second model to the measured positions of the second marks, the fitted second model representing a shape of each field region; and
outputting a sample map using the fitted first and second models.

16. A charged particle beam inspection system, comprising:
a sample holder configured to hold a sample having field regions;
an electron beam system configured to project one or more electron beams onto the sample and to detect signal electrons emitted from the sample; and
a controller comprising circuitry configured to:
cause the electron beam system to measure a position of a first mark in each of a plurality of the field regions;
fit a first model to the measured positions of the first marks, the fitted first model representing positions of the field regions;
cause the electron beam system to measure positions of a plurality of second marks in one field region or in each of a plurality of field regions;
fit a second model to the measured positions of the second marks, the fitted second model representing a shape of each field region; and
output a sample map using the fitted first and second models.

17. The system of claim 16, wherein either or both of the first and second models is/are configured to represent non-linear geometries.

18. The system of claim 16, wherein the controller comprises circuitry configured to cause the electron beam system to measure the positions of the second marks using the positions of the field regions represented by the fitted first model.

19. The system of claim 16, wherein the first model is configured to represent the positions of the field regions in an array having rows of field regions and columns of field regions, wherein at least one of the rows is non-linear and/or at least one of the columns is non-linear.

20. The system of claim 16, wherein the second model is configured to represent a shape of each field region such that at least a portion of a boundary of the shape is non-linear.

* * * * *